(12) United States Patent
Lee

(10) Patent No.: US 12,444,465 B2
(45) Date of Patent: Oct. 14, 2025

(54) MEMORY DEVICE AND METHOD FOR MANUFACTURING THE SAME

(71) Applicant: MACRONIX INTERNATIONAL CO., LTD., Hsinchu (TW)

(72) Inventor: Chih-Hsiung Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 829 days.

(21) Appl. No.: 17/730,256

(22) Filed: Apr. 27, 2022

(65) Prior Publication Data

US 2023/0352088 A1    Nov. 2, 2023

(51) Int. Cl.
G11C 16/04    (2006.01)
H10B 41/10    (2023.01)
H10B 41/27    (2023.01)

(52) U.S. Cl.
CPC ......... *G11C 16/0483* (2013.01); *H10B 41/10* (2023.02); *H10B 41/27* (2023.02)

(58) Field of Classification Search
CPC .... G11C 16/0483; H10B 41/10; H10B 41/27; H10B 43/10; H10B 43/27; H01L 23/5283
See application file for complete search history.

(56) References Cited

U.S. PATENT DOCUMENTS

2021/0335802 A1* 10/2021 Lee .................. H01L 21/76877

* cited by examiner

*Primary Examiner* — Robert G Bachner
(74) *Attorney, Agent, or Firm* — McClure, Qualey & Rodack, LLP

(57) ABSTRACT

A memory device and a method for manufacturing the same are provided. The memory device includes a stacked structure, a lower isolation structure in the stacked structure and two memory strings in the stacked structure. The stacked structure includes conductive layers. The lower isolation structure has an upper surface in a lower portion of the stacked structure. The lower isolation structure separates at least one conductive layer of the conductive layers into a first conductive strip and a second conductive strip. The first conductive strip and the second conductive strip are electrically isolated from each other. Two memory strings are electrically connected to the first conductive strip and the second conductive strip respectively.

16 Claims, 23 Drawing Sheets

MEMORY DEVICE AND METHOD FOR MANUFACTURING THE SAME

BACKGROUND

Technical Field

The disclosure relates to a memory device and a method for manufacturing the same, and more particularly to a memory device including a lower isolation structure and a method for manufacturing the same.

Description of the Related Art

In recent years, 3-dimensional (3D) memory devices have been widely used in various fields due to greater storage capacity and excellent electrical properties. However, disturbance generated between the elements in the memory device becomes more serious as the storage density and integration of 3-dimensional memory devices increases.

It is desirable to provide technology for memory devices and methods for manufacturing memory devices that can decrease disturbance in memory devices during operation.

SUMMARY

The present disclosure relates to a memory device including a lower isolation structure and a method for manufacturing a memory device including a lower isolation structure, which may decrease disturbance in memory devices during operation.

According to an embodiment of the present disclosure, a memory device is provided. The memory device includes a stacked structure, a lower isolation structure in the stacked structure and two memory strings in the stacked structure. The stacked structure includes conductive layers. The lower isolation structure has an upper surface in a lower portion of the stacked structure. The lower isolation structure separates at least one conductive layer of the conductive layers into a first conductive strip and a second conductive strip. The first conductive strip and the second conductive strip are electrically isolated from each other. Two memory strings are electrically connected to the first conductive strip and the second conductive strip respectively.

According to an embodiment of the present disclosure, a method for manufacturing a memory device is provided. The method includes: forming a layer stack along a first direction on a substrate; forming a lower isolation structure comprising a dielectric material in the layer stack, wherein the lower isolation structure extending down toward the substrate and extending along a second direction different from the first direction; forming an insulating stacked structure on the layer stack. The lower isolation structure is under the insulating stacked structure.

The above and other embodiments of the disclosure will become better understood with regard to the following detailed description of the non-limiting embodiment(s). The following description is made with reference to the accompanying drawings.

DETAILED DESCRIPTION

Figure 1A:
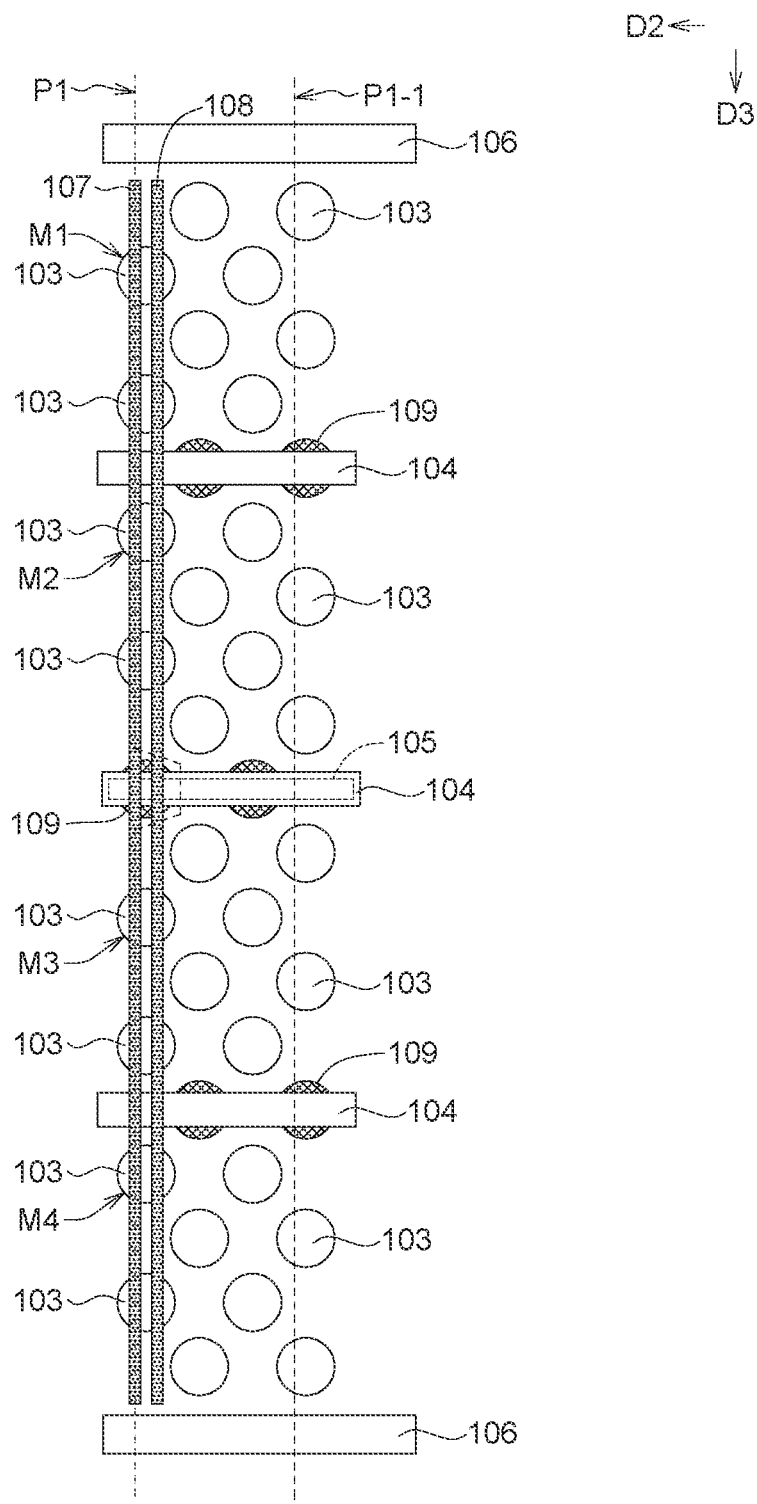
FIG. 1A illustrates a schematic top view of a memory device according to an embodiment of the present disclosure.

Various embodiments will be described more fully hereinafter with reference to accompanying drawings, which are provided for illustrative and explaining purposes rather than a limiting purpose. For clarity, the components may not be drawn to scale. In addition, some components and/or reference numerals may be omitted from some drawings. It is contemplated that the elements and features of one embodiment can be beneficially incorporated in another embodiment without further recitation.

The embodiments of the present disclosure could be implemented in many different 3D stacked memory structures in the applications. For example, the embodiment could be applied to, but not limited to, 3D NAND flash memory devices.

Figure 1B:
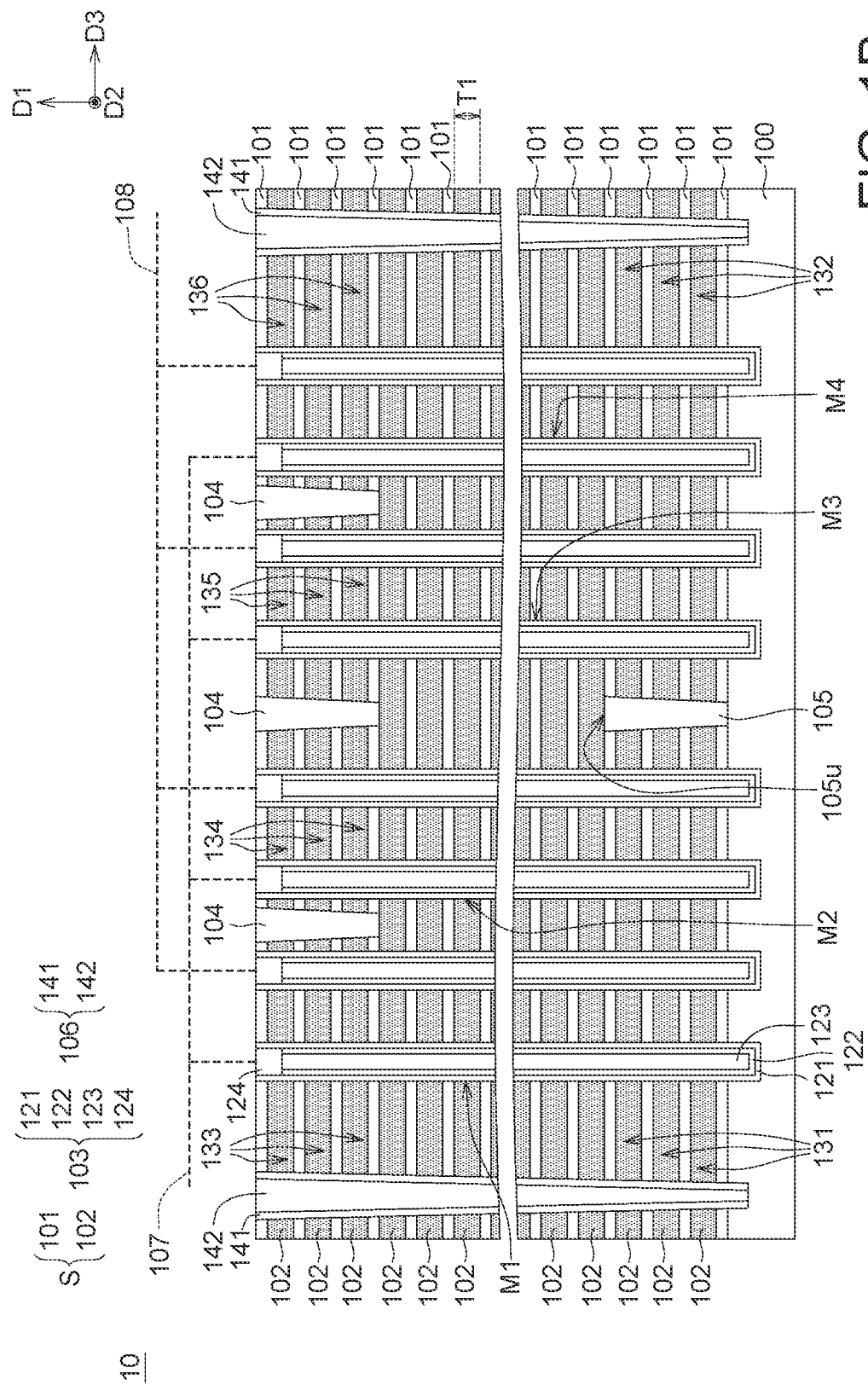
FIG. 1B illustrates a cross-section view of the memory device taken along a line P1 in FIG. 1A.

Referring to FIGS. 1A-1B, FIG. 1A illustrates a schematic top view of a memory device 10 according to an embodiment of the present disclosure, and FIG. 1B illustrates a cross-section view of the memory device 10 taken along a line P1 in FIG. 1A. The memory device 10 may include a substrate 100, a stacked structure S, pillar elements 103, at least one upper isolation structure 104, at least one lower isolation structure 105 and isolation elements 106.

The stacked structure S is over the substrate 100. The stacked structure S may include insulating layers 101 and conductive layers 102 stacked alternately along a first direction D1. The first direction D1, the second direction D2 and the third direction D3 may be perpendicular to each other. The first direction D1 may be a normal direction to an upper surface of the substrate 100. The first direction D1 may be a Z direction, the second direction D2 may be an X direction, and the third direction D3 may be a Y direction. The conductive layers 102 are separated from each other by the insulating layers 101. For clarity, FIG. 1B does not show all of the layers in the stacked structure S. The number of layers of the stacked structure S can be adjusted as needed. In an embodiment, the conductive layers 102 of the stacked structure S has a thickness T1 in the first direction D1, and the thickness T1 is about 200-350 angstroms (Å).

The pillar elements 103 are arranged apart in the stacked structure S. The pillar elements 103 may extend along the first direction D1 and pass through the stacked structure S. The pillar element 103 may include a memory layer 121, a channel layer 122, an insulating pillar 123 and a pad 124. The memory layer 121 may enclose the channel layer 122. The memory layer 121 may have a tubular shape, for example, the memory layer 121 may have a tubular shape with one open end and one closed end. A lower portion of the memory layer 121 is removed to expose a portion of the channel layer 122. The exposed portion of the channel layer 122 is electrically connected to the substrate 100. In another example, the memory layer 121 may have a tubular shape with two open ends. A bottom portion of the memory layer 121 is removed to expose a portion of the channel layer 122. The exposed portion of the channel layer 122 is electrically connected to the substrate 100. The channel layer 122 may be between the memory layer 121 and the insulating pillar 123. The channel layer 122 may enclose the insulating pillar 123. The channel layer 122 may have a tubular shape, for example, the channel layer 122 may have a tubular shape with one open end and one closed end. The pad 124 may be on the channel layer 122 and the insulating pillar 123. The pad 124 may be enclosed by the memory layer 121. The pad 124 may be electrically connected to the channel layer 122.

At least one upper isolation structure 104 is in the stacked structure S. The upper isolation structure 104 may extend along the first direction D1 and pass through one or more insulating layers 101 and/or one or more conductive layers 102 of the stacked structure S. For example, in the embodiment shown in FIG. 1B, the upper isolation structure 104 may be disposed in an upper portion of the stacked structure S, and passing through four insulating layers 101 and three conductive layers 102 in the upper portion of the stacked structure S. Specifically, the upper isolation structures 104 pass through three conductive layers 102 farthest from the substrate 100 among the conductive layers 102, and separate each of the three conductive layers 102 into conductive strips 133, 134, 135 and 136. The conductive strips 133, 134, 135 and 136 are electrically isolated from each other. In an embodiment, the upper isolation structures 104 may separate 3-7 conductive layers 102 in the upper portion of the stacked structure S.

At least one lower isolation structure 105 is in the stacked structure S. The lower isolation structure 105 may extend along the first direction D1 and pass through one or more insulating layers 101 and/or one or more conductive layers 102 of the stacked structure S. For example, in the embodiment shown in FIG. 1B, the lower isolation structure 105 may be disposed in a lower portion of the stacked structure S, and passing through four insulating layers 101 and three conductive layers 102 in the lower portion of the stacked structure S. The lower isolation structure 105 may have an upper surface 105$u$ in the lower portion of the stacked structure S. In one example, the lower isolation structure 105 may extend from upper surface 105$u$ to the substrate 100. The lower isolation structure 105 passes through at least three conductive layers 102 closest to the substrate 100 among the conductive layers 102, and separates each of the at least three conductive layers 102 into conductive strips 131 and 132. The conductive strip 131 (for example, a first conductive strip) and the conductive strip 132 (for example, a second conductive strip) may be on opposite sides of the lower isolation structure 105. The conductive strips 131 and 132 are electrically isolated from each other. In an embodiment, the lower isolation structure 105 may separate at least three conductive layers 102 in the lower portion of the stacked structure S. For example, the lower isolation structure 105 may separate 3-10 conductive layers 102 in the lower portion of the stacked structure S.

In this embodiment, the number of the upper isolation structures 104 is more than that of the lower isolation structures 105, and one of the upper isolation structures 104 may at least partially overlap the lower isolation structure 105 in the first direction D1. In one embodiment, the position of the lower isolation structure 105 in a plane containing the second direction D2 and the third direction D3 may roughly align with a position of one of the upper isolation structures 104; for example, in FIG. 1A, the lower isolation structure 105 that roughly align with one of the upper isolation structures 104 is indicated by dashed lines.

The isolation elements 106 are arranged apart in the stacked structure S. As shown in FIG. 1A, the isolation element 106 may be a stripe extending along the second direction D2. As shown in FIG. 1B, the isolation element 106 may extend along the first direction D1 and pass through the stacked structure S. The isolation elements 106 may include an isolation film 141 and a conductive film 142. The isolation film 141 may be between the conductive film 142 and the stacked structure S. The isolation film 141 may be used to electrically isolate the conductive film 142 from the conductive layers 102. A bottom portion of isolation film 141 is removed to expose a portion of conductive film 142. The exposed portion of the conductive film 142 is electrically connected to the substrate 100. The isolation element 106 may be functioned as a source line, such as a common source line.

The memory device 10 may further include a plurality of memory strings in the stacked structure S. Each of the plurality of memory strings may include memory cells arranged along the first direction D1. The memory cells may be defined in the memory layer 121 at intersections between the conductive layers 102 and the channel layer 122 of the pillar element 103. It should be noted that four memory strings M1, M2, M3 and M4 are shown in FIGS. 1A-1B for convenience of discussion but, in practice, a memory device can include more memory strings. The memory string M1 may share the channel layer 122 of the pillar element 103 where the memory string M1 is located. The memory string M1 may be electrically connected to this channel layer 122, the conductive strip 131 and the conductive strip 133. The memory string M2 may share the channel layer 122 of the pillar element 103 where the memory string M2 is located, and the memory string M2 may be electrically connected to this channel layer 122, the conductive strip 131 and the conductive strip 134. The memory string M3 may share the channel layer 122 of the pillar element 103 where the memory string M3 is located, and the memory string M3 may be electrically connected to this channel layer 122, the conductive strip 132 and the conductive strip 135. The memory string M4 may share the channel layer 122 of the pillar element 103 where the memory string M4 is located, and the memory string M4 may be electrically connected to this channel layer 122, the conductive strip 132 and the conductive strip 136.

In an embodiment, the memory device 10 may include at least one string selection line and at least one ground selection line electrically connected to opposite ends of the memory string. For example, the three conductive layers 102 farthest from the substrate 100 (the conductive strips 133, 134, 135 and 136) among the conductive layers 102 of the memory device 10 may be functioned as string selection lines for memory strings. The memory cells defined in the memory layers 121 at intersections between the conductive strips 133, 134, 135 and 136 and the channel layers 122 of the pillar elements 103 may be functioned as string selection transistors. The three conductive layers 102 closest to the substrate 100 (the conductive strips 131 and 132) among the conductive layers 102 of the memory device 10 may be functioned as ground selection lines for memory strings. The memory cells defined in the memory layers 121 at intersections between the conductive strips 131, 132 and the channel layers 122 of the pillar elements 103 may be functioned as ground selection transistors. The other conductive layers 102 in the memory device 10 (for example, the conductive layers 102 not separated by the upper isolation structure 104 and the lower isolation structure 105) may be functioned as word lines. In the memory device 10, the conductive layers 102 functioned as string selection lines are separated into conductive strips 133, 134, 135 and 136 by the upper isolation structures 104. The conductive strips 133, 134, 135 and 136 are electrically isolated from each other. Therefore, the string selection transistors electrically connected to the memory strings M1, M2, M3 and M4 respectively can be controlled individually through different string selection lines. In the memory device 10, the conductive layers 102 functioned as ground selection lines are separated into conductive strips 131 and 132 by the lower isolation structures 105. The conductive strips 131 and 132 are electrically isolated from each other. Therefore, the ground selection transistors electrically connected to the memory strings M1 and M2 respectively can be controlled through one ground selection line. The ground selection transistors electrically connected to the memory strings M3 and M4 respectively can be controlled through the other ground selection line.

The memory device 10 may further include at least one first upper conductive structure 107 and at least one second upper conductive structure 108 above the stacked structure S. The first upper conductive structure 107 and the second upper conductive structure 108 may be electrically connected to the channel layer 122 and the pad 124 of the different pillar elements 103, respectively. In this embodiment, the first upper conductive structure 107 and the second upper conductive structure 108 are disposed on eight pillar elements 103 arranged in the third direction D3 (as shown in FIG. 1A), the first upper conductive structure 107 is electrically connected to the channel layers 122 of four of these eight pillar elements 103 (as shown in FIG. 1B) and the memory strings M1, M2, M3 and M4, and the second upper conductive structure 108 is electrically connected to the channel layers 122 of the other four of these eight pillar elements 103 (indicated by dashed lines in FIG. 1B) and the other memory strings. The first upper conductive structure 107 and the second upper conductive structure 108 may be functioned as bit lines.

In an embodiment, the memory device 10 may include blocks separated from each other by isolation elements 106. Each block may include sub-blocks separated from each other by the upper isolation structures 104. The operations, such as read operations, erase operations, etc., of the memory device 10 can be performed by sub-blocks.

Figure 1C:
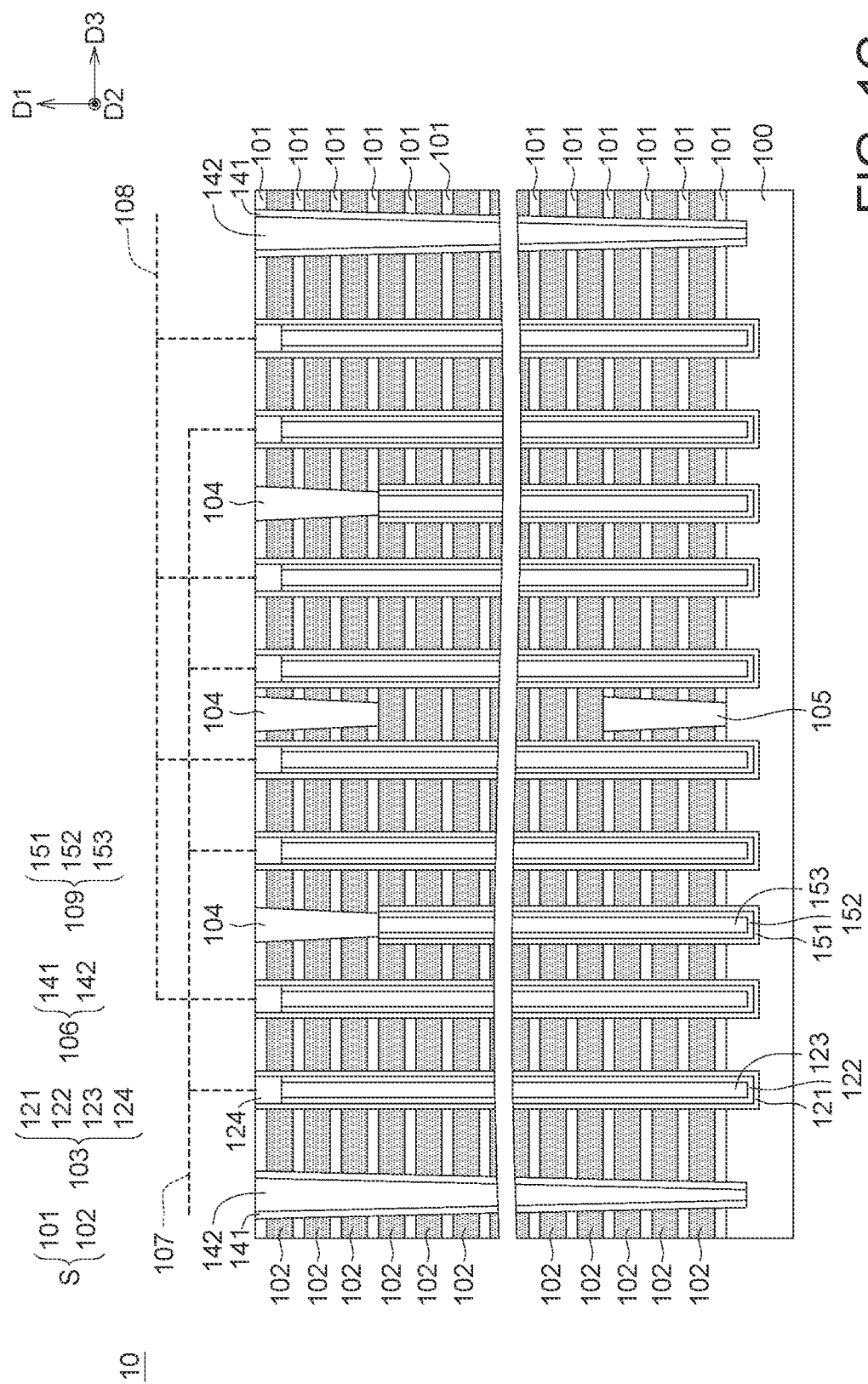
FIG. 1C illustrates a cross-section view of the memory device taken along a line P1-1 in FIG. 1A.

FIG. 1C illustrates a cross-section view of the memory device 10 taken along a line P1-1 in FIG. 1A. In an embodiment, the memory device 10 may include tubular elements 109 arranged apart in the stacked structure S. The tubular element 109 may extend along the first direction D1 and pass through the stacked structure S. The tubular element 109 may be under the upper isolation structure 104. The tubular element 109 may include a memory layer 151, a dummy channel layer 152 and an insulating pillar 153. The memory layer 151 may enclose the dummy channel layer 152. The memory layer 151 may have a tubular shape, for example, the memory layer 151 may have a tubular shape with on open end and one closed end. The dummy channel layer 152 may be between the memory layer 151 and the insulating pillar 153. The dummy channel layer 152 may enclose the insulating pillar 153. The dummy channel layer 152 may have a tubular shape, for example, the dummy channel layer 152 may have a tubular shape with on open end and one closed end. The memory layer 151 of the tubular element 109 may be similar to the memory layer 121 of the pillar element 103. The insulating pillar 153 of the tubular element 109 may be similar to the insulating pillar 123 of the pillar element 103. In an embodiment, the dummy channel layer 152 may mean that the dummy channel layer 152 has no drive circuitry. In an embodiment, the dummy channel layer 152 may be understood as an electrically floating element.

In an embodiment, the control circuitry, such as CMOS logic circuits, may be disposed in a periphery region of the memory device 10 to form a CMOS next to array (CnA) architecture. In an embodiment, the control circuitry, such as CMOS logic circuits, may be disposed directly beneath the memory device 10 to form a CMOS under array (CuA) architecture. In an embodiment, the control circuitry, such as CMOS logic circuits, may be bonded to the memory device 10 to form a CMOS bonded array (CbA) architecture.

Figure 1D:
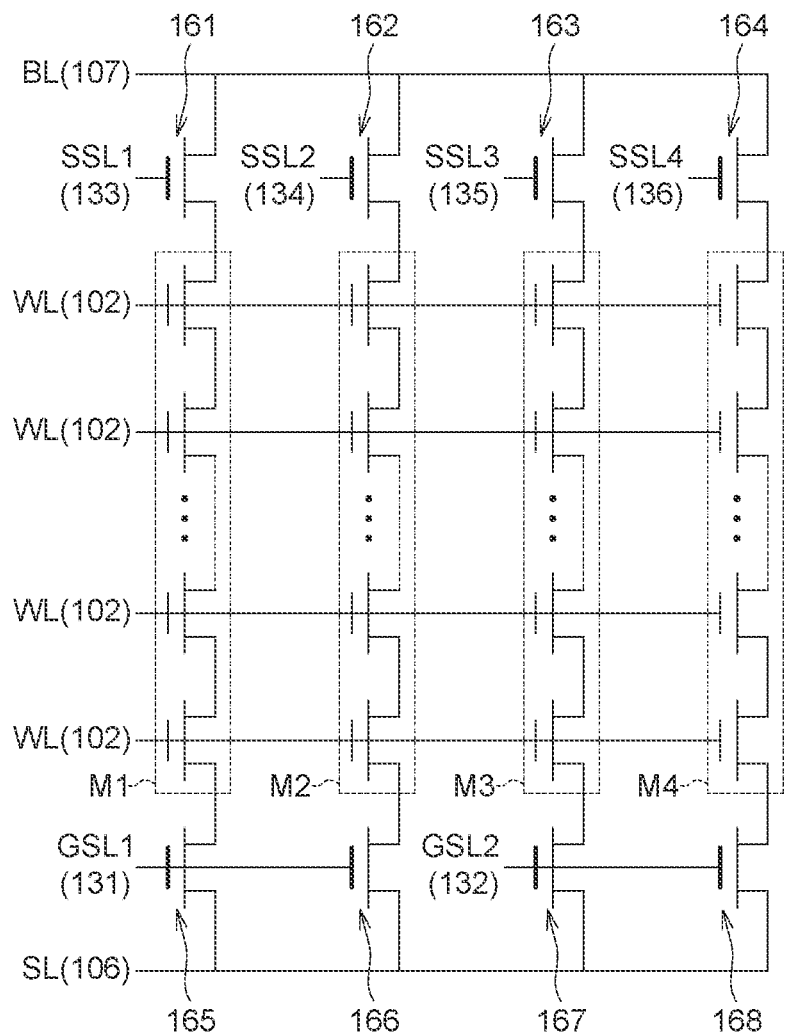
FIG. 1D illustrates an equivalent circuit diagram of a memory device according to an embodiment of the present disclosure.

Referring to FIG. 1D, FIG. 1D illustrates an equivalent circuit diagram of the memory strings M1, M2, M3 and M4 of the memory device 10 in FIG. 1B. In FIG. 1B, each of the memory strings M1, M2, M3 and M4 is electrically connected to three string selection lines and three ground selection lines; however, it should be noted that a string selection line and a ground selection line electrically connected to opposite ends of a memory string are shown in FIG. 1D for convenience of discussion.

A plurality of word lines WL (for example, the conductive layers 102) are electrically connected to the memory strings M1, M2, M3 and M4. The memory strings M1, M2, M3 and M4 are electrically connected between a bit line BL (for example, the first upper conductive structure 107) and a source line SL.

A string selection line SSL1 (for example, the conductive strip 133) and a ground selection line GSL1 (for example, the conductive strip 131) are electrically connected to opposite ends of the memory string M1. The string selection line SSL1 is electrically connected between the bit line BL and the memory string M1, and a string selection transistor 161 can be defined at an Intersection between the string selection line SSL1 and the memory string M1. The ground selection line GSL1 is electrically connected between the source line SL and the memory string M1, and a ground selection transistor 165 can be defined at an intersection between the ground selection line GSL1 and the memory string M1. A string selection line SSL2 (for example, the conductive strip 134) and a ground selection line GSL1 (for example, the conductive strip 131) are electrically connected to opposite ends of the memory string M2. The string selection line SSL2 is electrically connected between the bit line BL and the memory string M2, and a string selection transistor 162 can be defined at an intersection between the string selection line SSL2 and the memory string M2. The ground selection line GSL1 is electrically connected between the source line SL and the memory string M2, and a ground selection transistor 166 can be defined at an intersection between the ground selection line GSL1 and the memory string M2. A string selection line SSL3 (for example, the conductive strip 135) and a ground selection line GSL2 (for example, the conductive strip 132) are electrically connected to opposite ends of the memory string M3. The string selection line SSL3 is electrically connected between the bit line BL and the memory string M3, and a string selection transistor 163 can be defined at an intersection between the string selection line SSL3 and the memory string M3. The ground selection line GSL2 is electrically connected between the source line SL and the memory string M3, and a ground selection transistor 167 can be defined at an intersection between the ground selection line GSL2 and the memory string M3. A string selection line SSL4 (for example, the conductive strip 136) and a ground selection line GSL2 (for example, the conductive strip 132) are electrically connected to opposite ends of the memory string M4. The string selection line SSL4 is electrically connected between the bit line BL and the memory string M4, and a string selection transistor 164 can be defined at an intersection between the string selection line SSL4 and the memory string M4. The ground selection line GSL2 is electrically connected between the source line SL and the memory string M4, and a ground selection transistor 168 can be defined at an intersection between the ground selection line GSL2 and the memory string M4.

During a read operation of the memory device 10 shown in FIG. 1D, for example, a read operation that accesses a selected memory cell on the memory string M1, a voltage is applied to the string selection line SSL1 electrically connected to the memory string M1 to turn on the string selection transistor 161 electrically connected to the string selection line SSL1, and a voltage is applied to the ground selection line GSL1 electrically connected to the memory string M1 to turn on the ground selection transistor 165 electrically connected to the ground selection line GSL1. Since the memory string M1 and the memory string M2 are both electrically connected to the ground selection line GSL1, the ground selection transistor 166 electrically connected to the memory string M2 would be turned on during this read operation.

During this read operation, the memory string M3 and the memory string M4 are not electrically connected to the ground selection line GSL1, the ground selection transistor 167 electrically connected to the memory string M3 and the ground selection transistor 168 electrically connected to the memory string M4 can remain off, and no capacitance is generated in the channel layers 122 electrically connected to the memory string M3 and the memory string M4. In an embodiment, the channel layers 122 electrically connected to the memory string M3 and the memory string M4 can be in an electrically floating state.

Figure 2A:
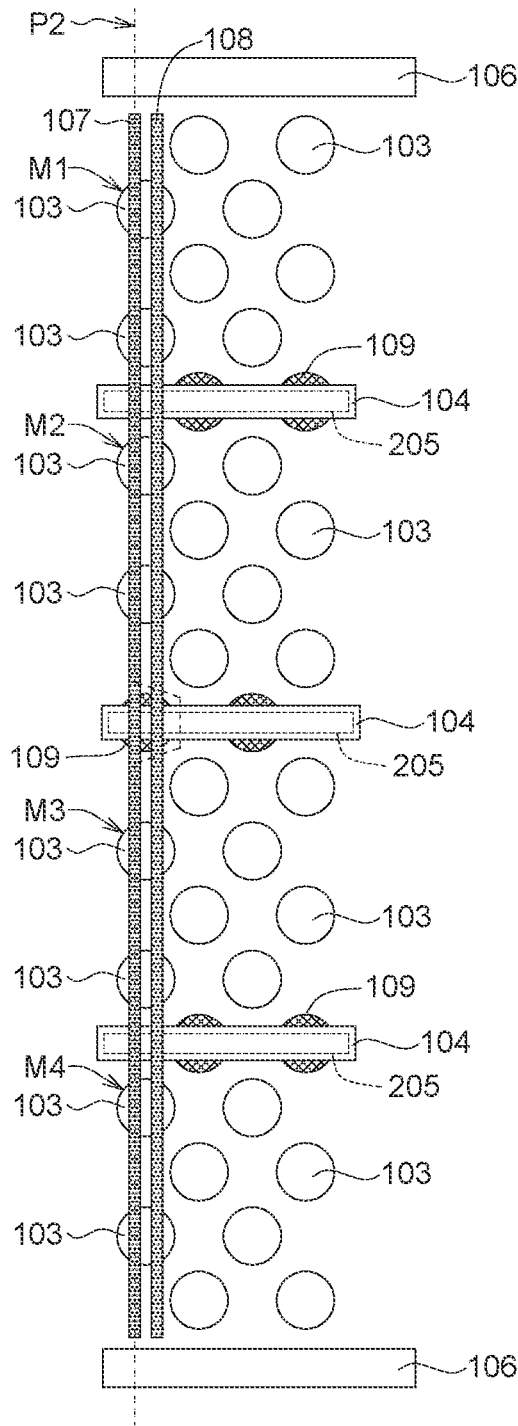
FIG. 2A illustrates a schematic top view of a memory device according to an embodiment of the present disclosure.
Figure 2B:
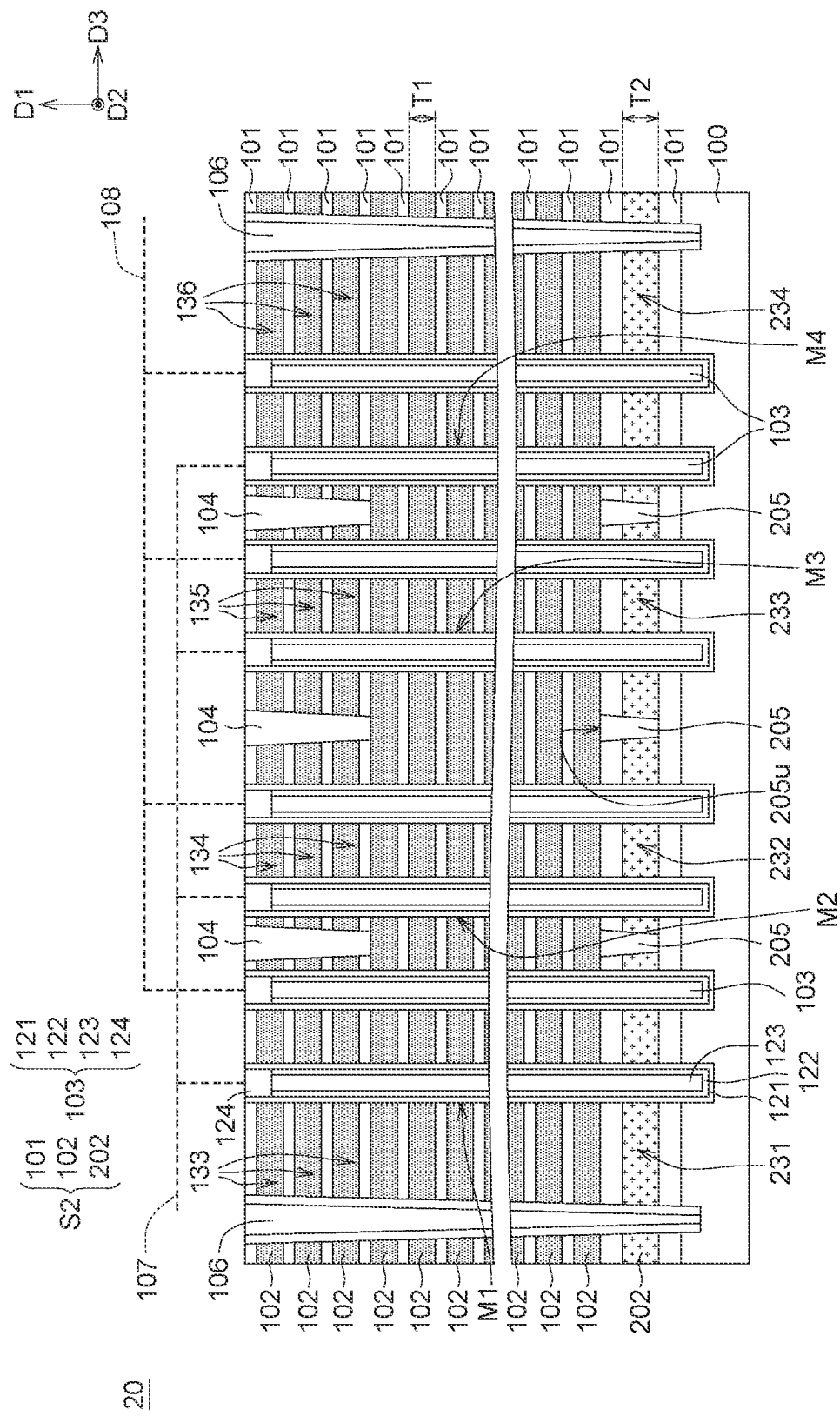
FIG. 2B illustrates a cross-section view of the memory device taken along a line P2 in FIG. 2A.

Referring to FIGS. 2A-2B, FIG. 2A illustrates a schematic top view of a memory device 20 according to another embodiment of the present disclosure, and FIG. 2B illustrates a cross-section view of the memory device 20 taken along a line P2 in FIG. 2A. The differences between the memory device 20 and the memory device 10 are that, the stacked structure S2 of the memory device 20 is different from the stacked structure S of the memory device 10, and number and arrangement of the lower isolation structures 205 of the memory device 20 are different from those of the lower isolation structures 105 of the memory device 10. The differences between the memory device 20 and the memory device 10 are specifically described as follows.

The memory device 20 may include a stacked structure S2 on the substrate 100. The stacked structure S2 may include insulating layers 101 and conductive layers 102 stacked alternately along the first direction D1. The conductive layers 102 are separated from each other by the insulating layers 101. The stacked structure S2 may include a conductive layer 202 under the conductive layers 102 and on the substrate 100. An insulating layer 101 may be disposed between the conductive layer 202 and the conductive layer 102. An insulating layer 101 may be disposed between the conductive layer 202 and the substrate 101. For clarity, FIG. 2B does not show all of the layers in the stacked structure S2. The number of layers of the stacked structure S2 can be adjusted as needed.

The memory device 20 may include lower isolation structures 205 in the stacked structure S2. The lower isolation structure 205 may extend along the first direction D1 and pass through the conductive layer 202 of the stacked structure S2. For example, in the embodiment shown in FIG. 2B, the lower isolation structure 205 may be disposed in a lower portion of the stacked structure S2, and passing through the conductive layer 202 in the lower portion of the stacked structure S2. The lower isolation structure 205 may have an upper surface 205u in the lower portion of the stacked structure S2. Specifically, the lower isolation structures 205 pass through the conductive layer closest to the substrate 100 (for example, the conductive layer 202) among the stacked structure S2, and separate the conductive layer 202 into conductive strips 231, 232, 233 and 234. The conductive strips 231, 232, 233 and 234 are electrically isolated from each other. The conductive strip 231 (for example, a first conductive strip) and the conductive strip 232 (for example, a second conductive strip) may be on opposite sides of the lower isolation structure 205. The conductive strip 232 and the conductive strip 233 may be on opposite sides of the lower isolation structure 205. The conductive strip 233 and the conductive strip 234 may be on opposite sides of the lower isolation structure 205.

In an embodiment, in the memory device 20, the number of the upper isolation structures 104 may be equal to that of the lower isolation structures 205, and the arrangement of the upper isolation structures 104 in the third direction D3 may be similar to that of the lower isolation structures 205 in the third direction D3. The lower isolation structures 205 may be between the sub-blocks defined by the upper isolation structures 104. In an embodiment, the upper isolation structures 104 may at least partially overlap the lower isolation structures 205 respectively in the first direction D1. In an embodiment, the position of the lower isolation structures 205 in a plane containing the second direction D2 and the third direction D3 may roughly align with the position of the upper isolation structures 104; for example, in FIG. 2A, the lower isolation structures 205 that roughly align with the upper isolation structures 104 respectively are indicated by dashed lines.

In the stacked structure S2, the conductive layer 102 (can be understood as the conductive layer not separated by the lower isolation structures 205) has a thickness T1. At least one conductive layer 202 near a bottom of the stacked structure S2 (can be understood as the conductive layer acting as at least one ground selection line and separated by the lower isolation structures 205) has a thickness T2, and the thickness T2 may be larger than the thickness T1. In an embodiment, the thickness T1 of the conductive layer 102 is about 200-350 angstroms (Å). The thickness T2 of the at least one conductive layer 202 near the bottom of the stacked structure S2 is about 1000-2500 angstroms (Å). A ratio of the thickness T2 to the thickness T1 (T2/T1) is in a range of 4 to 7. In one example, the material of the conductive layer 202 may be different from that of the conductive layer 102. The conductive layer 102 comprises tungsten. The conductive layer 202 comprises polysilicon.

The memory string M1 of the memory device 20 is electrically connected to the conductive strips 231 and 133. The memory string M2 of the memory device 20 is electrically connected to the conductive strips 232 and 134. The memory string M3 of the memory device 20 is electrically connected to the conductive strips 233 and 135. The memory string M4 of the memory device 20 is electrically connected to the conductive strips 234 and 136. The conductive strips 133, 134, 135 and 136 may be functioned as string selection lines for memory strings; the memory cells defined in the memory layers 121 at intersections between the conductive strips 133, 134, 135 and 136 and the channel layers 122 of the pillar elements 103 may be functioned as string selection transistors. The conductive strips 231, 232, 233 and 234 may be functioned as ground selection lines for memory strings; the memory cells defined in the memory layers 121 at intersections between the conductive strips 231, 232, 233 and 234 and the channel layers 122 of the pillar elements 103 may be functioned as ground selection transistors. The other conductive layers 102 in the memory device 20 (for example, the conductive layers 102 not separated by the upper isolation structure 104) may be functioned as word lines. In the memory device 20, the string selection transistors electrically connected to the memory strings M1, M2, M3 and M4 respectively can be controlled individually through different string selection lines, and the ground selection transistors electrically connected to the memory strings M1, M2, M3 and M4 respectively can be controlled individually through different ground selection lines.

Figure 2C:
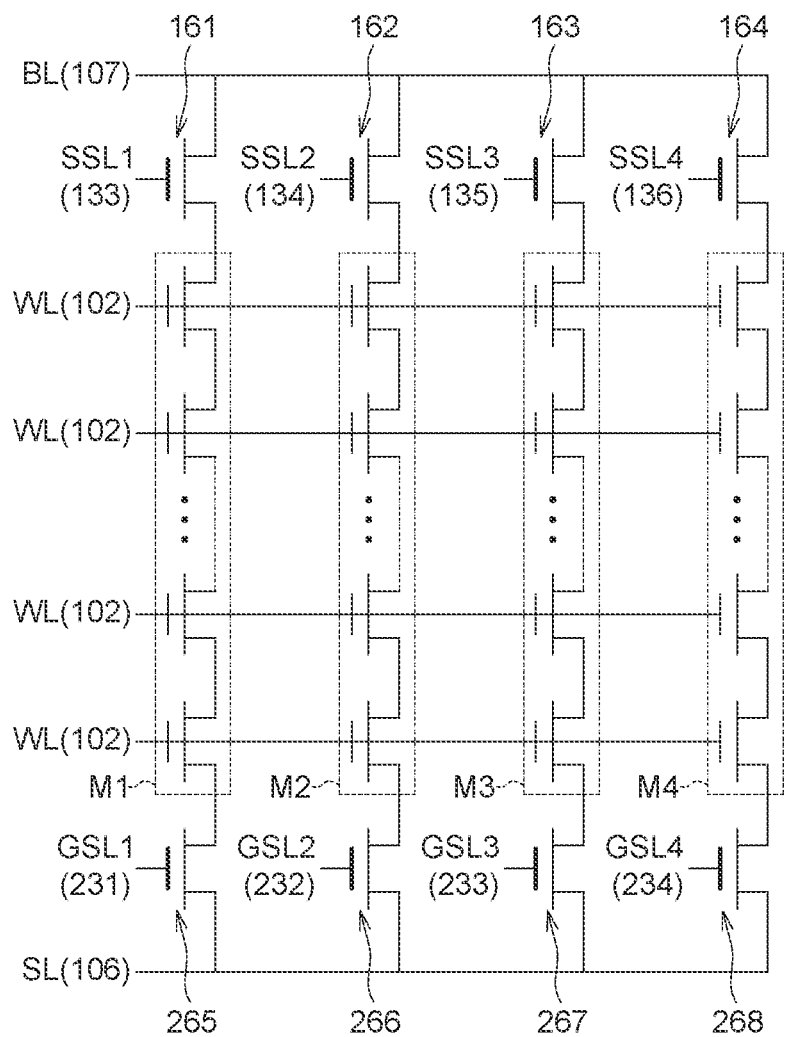
FIG. 2C illustrates an equivalent circuit diagram of a memory device according to an embodiment of the present disclosure.

Referring to FIG. 2C, FIG. 2C illustrates an equivalent circuit diagram of the memory strings M1, M2, M3 and M4 of the memory device 20 in FIG. 2B. In FIG. 2B, each of the memory strings M1, M2, M3 and M4 is electrically connected to three string selection lines and one ground selection line; however, it should be noted that a string selection line and a ground selection line electrically connected to opposite ends of a memory string are shown in FIG. 2C for convenience of discussion.

A plurality of word lines WL (for example, the conductive layers 102) are electrically connected to the memory strings M1, M2, M3 and M4. The memory strings M1, M2, M3 and M4 are electrically connected between a bit line BL (for example, the first upper conductive structure 107) and a source line SL.

A string selection line SSL1 (for example, the conductive strip 133) and a ground selection line GSL1 (for example, the conductive strip 231) are electrically connected to opposite ends of the memory string M1. The string selection line SSL1 is electrically connected between the bit line BL and the memory string M1, and a string selection transistor 161 can be defined at an Intersection between the string selection line SSL1 and the memory string M1. The ground selection line GSL1 is electrically connected between the source line SL and the memory string M1, and a ground selection transistor 265 can be defined at an intersection between the ground selection line GSL1 and the memory string M1. A string selection line SSL2 (for example, the conductive strip 134) and a ground selection line GSL2 (for example, the conductive strip 232) are electrically connected to opposite ends of the memory string M2. The string selection line SSL2 is electrically connected between the bit line BL and the memory string M2, and a string selection transistor 162 can be defined at an intersection between the string selection line SSL2 and the memory string M2. The ground selection line GSL2 is electrically connected between the source line SL and the memory string M2, and a ground selection transistor 266 can be defined at an intersection between the ground selection line GSL2 and the memory string M2. A string selection line SSL3 (for example, the conductive strip 135) and a ground selection line GSL3 (for example, the conductive strip 233) are electrically connected to opposite ends of the memory string M3. The string selection line SSL3 is electrically connected between the bit line BL and the memory string M3, and a string selection transistor 163 can be defined at an intersection between the string selection line SSL3 and the memory string M3. The ground selection line GSL3 is electrically connected between the source line SL and the memory string M3, and a ground selection transistor 267 can be defined at an intersection between the ground selection line GSL3 and the memory string M3. A string selection line SSL4 (for example, the conductive strip 136) and a ground selection line GSL4 (for example, the conductive strip 234) are electrically connected to opposite ends of the memory string M4. The string selection line SSL4 is electrically connected between the bit line BL and the memory string M4, and a string selection transistor 164 can be defined at an intersection between the string selection line SSL4 and the memory string M4. The ground selection line GSL4 is electrically connected between the source line SL and the memory string M4, and a ground selection transistor 268 can be defined at an intersection between the ground selection line GSL4 and the memory string M4.

During a read operation of the memory device 20 shown in FIG. 2C, for example, a read operation that accesses a selected memory cell on the memory string M1, a voltage is applied to the string selection line SSL1 electrically connected to the memory string M1 to turn on the string selection transistor 161 electrically connected to the string selection line SSL1, and a voltage is applied to the ground selection line GSL1 electrically connected to the memory string M1 to turn on the ground selection transistor 265 electrically connected to the ground selection line GSL1.

During this read operation, the memory string M2, memory string M3 and memory string M4 are not electrically connected to the ground selection line GSL1, the ground selection transistor 266 electrically connected to the memory string M2, the ground selection transistor 267 electrically connected to the memory string M3 and the ground selection transistor 268 electrically connected to the memory string M4 can remain off, and no capacitance is generated in the channel layers 122 electrically connected to the memory string M2, the memory string M3 and the memory string M4. In an embodiment, the channel layers 122 electrically connected to the memory string M2, the memory string M3 and the memory string M4 can be in an electrically floating state.

In a comparative example, the memory device does not include a lower isolation structure, and all of the memory strings M1, M2, M3 and M4 are electrically connected to a ground selection line. During operations of the memory device, applying a voltage to the ground selection line would turn on all of the ground selection transistors at intersections between the ground selection line and the memory strings M1, M2, M3 and M4, the memory strings M1, M2, M3 and M4 would be affected by the voltage applied to the ground selection line, and capacitance is generated in the channel layers 122 electrically connected to the memory strings M1, M2, M3 and M4, thereby causing problems of increased loads on the word lines and increased read disturbance.

In an embodiment of the present disclosure, as shown in FIGS. 1A-1D, the lower isolation structure 105 separates at least one conductive layer 102 in a lower portion of the stacked structure S into the conductive strip 131 (for example, a first conductive strip) and conductive strip 132

(for example, a second conductive strip) electrically isolated from each other and functioned as ground selection lines, and the memory strings electrically connected to different ground selection lines can be controlled separately. Specifically, applying a voltage to one of the ground selection lines would turn on the ground selection transistors 165 and 166 electrically connected to the memory strings M1 and M2 or the ground selection transistors 167 and 168 electrically connected to the memory strings M3 and M4, and would not cause capacitance to be generated in all of the channel layers electrically connected to the memory strings M1, M2, M3 and M4. Therefore, as compared with the comparative example, loads on the word lines in this embodiment are decreased by 50%, and the problem of read disturbance can be decreased.

In another embodiment of the present disclosure, as shown in FIGS. 2A-2C, the lower isolation structures 205 separate the conductive layer 202 in a lower portion of the stacked structure S2 into the conductive strip 231 (for example, a first conductive strip), the conductive strip 232 (for example, a second conductive strip), the conductive strip 233 and the conductive strip 234 electrically isolated from each other and functioned as ground selection lines, and the memory strings electrically connected to different ground selection lines can be controlled separately. Specifically, applying a voltage to one of the ground selection lines would turn on one of the ground selection transistors 265, 266, 267 and 268 electrically connected to the memory strings M1, M2, M3 and M4, and would not cause capacitance to be generated in all of the channel layers electrically connected to the memory strings M1, M2, M3 and M4. Therefore, as compared with the comparative example, loads on the word lines in this embodiment are decreased by 75%, and the problem of read disturbance can be decreased.

Referring to FIGS. 3-10, FIGS. 3-10 schematically illustrate a method for manufacturing a memory device according to an embodiment of the present disclosure.

Figure 3:
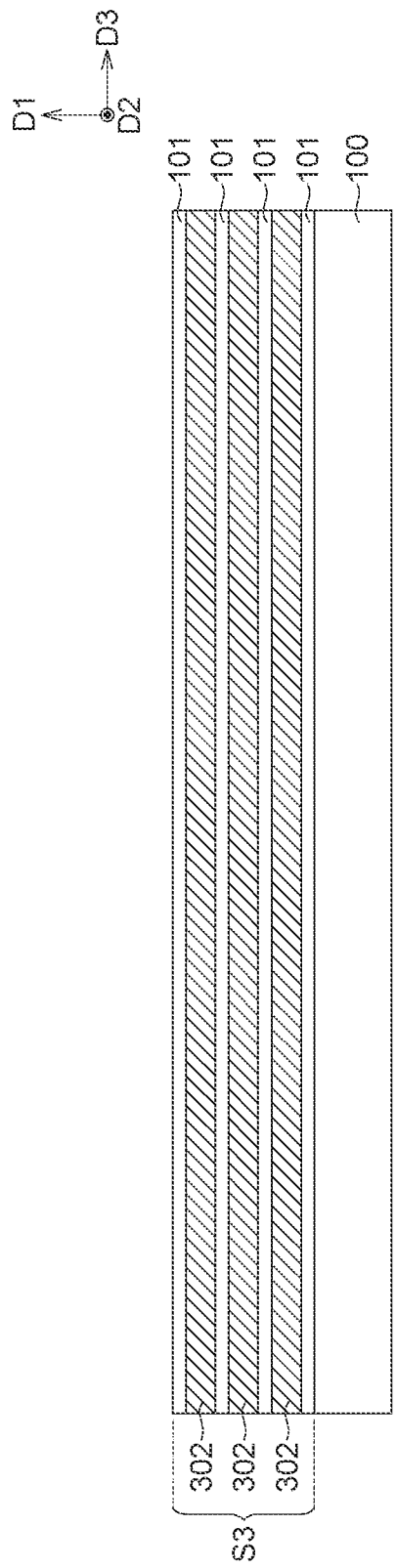
FIGS. 3-10 schematically illustrate a method for manufacturing a memory device according to an embodiment of the present disclosure.

Referring to FIG. 3, a substrate 100 is provided. A layer stack S3 is formed on the substrate 100. The layer stack S3 may include at least one insulating layer 101 and at least one dielectric layer 302 stacked alternately along the first direction D1. For example, the layer stack S3 may be formed by depositing the insulating layers 101 and the dielectric layers 302 sequentially. The substrate 100 may include a doped semiconductor material or an undoped semiconductor material, such as silicon. The present disclosure is not limited thereto. The insulating layer 101 may include oxide such as silicon oxide, or other suitable dielectric materials. The dielectric layer 302 may include nitride such as silicon nitride, or other suitable dielectric materials. In an embodiment, the insulating layer 101 and the dielectric layer 302 may include different materials.

Figure 4:
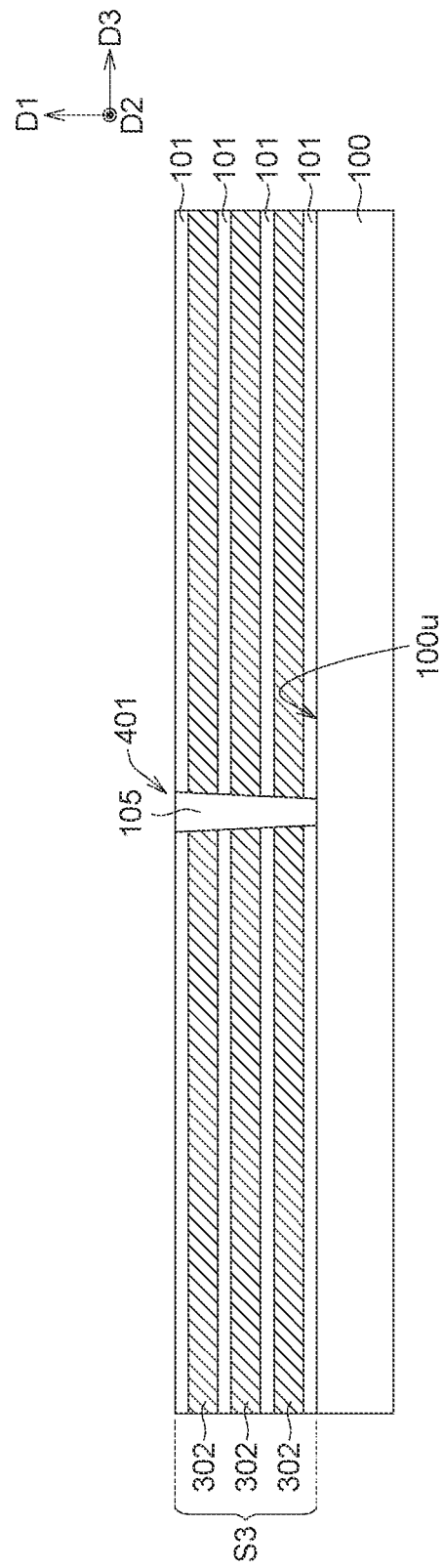

Referring to FIG. 4, a lower isolation structure 105 is formed in the layer stack S3. The lower isolation structure 105 may extend down toward the substrate 100. The lower isolation structure 105 may extend along the first direction D1 and the second direction D2 and separate at least one insulating layer 101 and at least one dielectric layer 302 in the layer stack S3 into two parts isolated from each other. For example, an etching process, such as a wet etching process or a dry etching process, may be performed to the layer stack S3 to remove part of the layer stack S3 to form a trench 401; the trench 401 extends downwards along the first direction D1 and stops at an upper surface 100u of the substrate 100; the trench 401 exposes sidewall of the layer stack S3 serving as the sidewall of the trench 401 and a portion of the upper surface 100u of the substrate 100 serving as the bottom of the trench 401; the lower isolation structure 105 may then be formed in the trench 401 by a deposition process. The lower isolation structure 105 may include a dielectric material, such as oxide.

Figure 5:
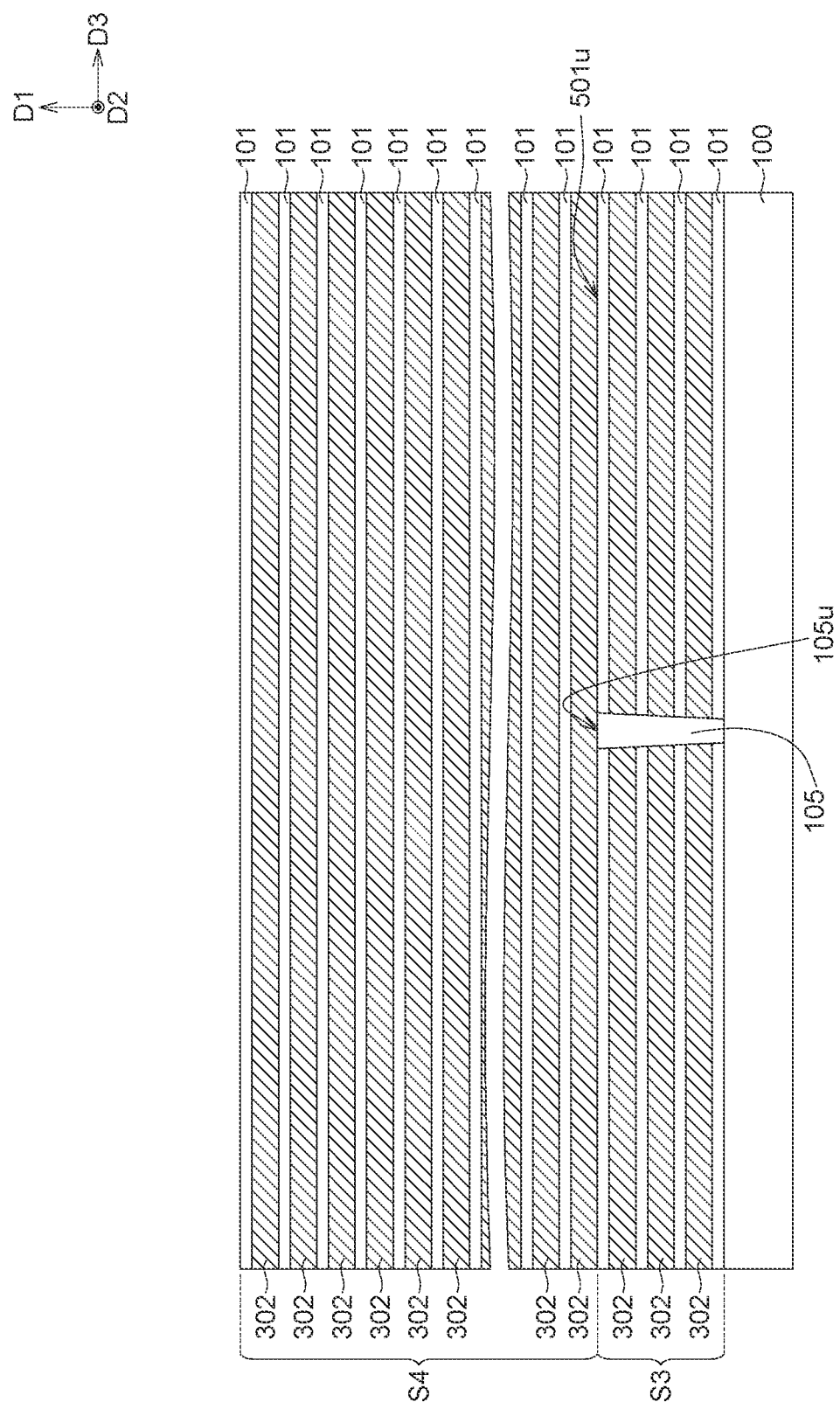

Referring to FIG. 5, an insulating stacked structure S4 is formed on the layer stack S3. The insulating stacked structure S4 may cover an upper surface 105u of the lower isolation structure 105 and an upper surface 501u of the layer stack S3. The lower isolation structure 105 and the layer stack S3 may be under the insulating stacked structure S4. The insulating stacked structure S4 may include insulating layers 101 and dielectric layers 302 stacked alternately along the first direction D1. For example, the insulating stacked structure S4 may be formed by depositing the insulating layers 101 and the dielectric layers 302 sequentially. In an embodiment, the number of layers of the insulating stacked structure S4 may be larger than the number of layers of the layer stack S3.

Figure 6:
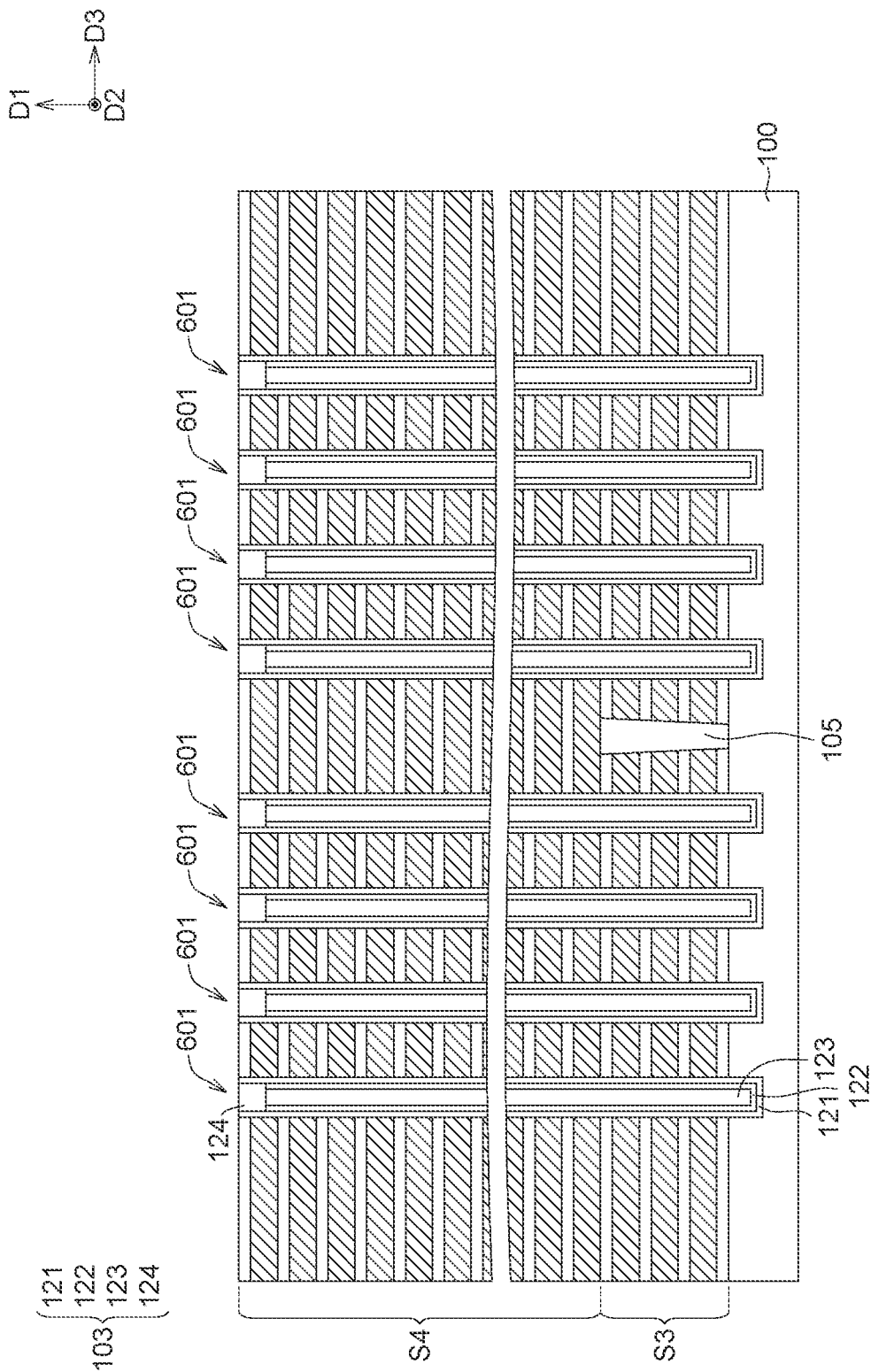

Referring to FIG. 6, pillar elements 103 are formed. The pillar elements 103 may be arranged apart in the insulating stacked structure S4 and the layer stack S3. The pillar elements 103 may be on opposite sides of the lower isolation structure 105. The pillar element 103 may extend along the first direction D1 and pass through the insulating stacked structure S4 and the layer stack S3. In an embodiment, the formation of the pillar element 103 may include the following steps. The insulating stacked structure S4 and the layer stack S3 are patterned, such as by a photolithography process, to form holes 601 separated from each other. The hole 601 extends downwards along the first direction D1 and stops at the substrate 100; the hole 601 exposes sidewalls of the insulating stacked structure S4 and the layer stack S3 serving as the sidewall of the hole 601 and exposes the substrate 100 serving as the bottom of the hole 601. Next, a memory layer 121 may line the hole 601 by a deposition process and a bottom portion of the memory layer 121 is removed by an etching process. A channel layer 122 may be deposited on sidewalls of the memory layer 121 and contacts with the substrate 100 through the exposed bottom portion of the memory layer 121. An insulating pillar 123 may fill the remaining space in the hole 601 by a deposition process. Then, an etching back process and/or a chemical-mechanical planarization (CMP) process may be performed to remove part of the channel layer 122 and part of the insulating pillar 123 to expose part of the sidewall of the memory layer 121. Then, a pad 124 may be formed on the channel layer 122 and the insulating pillar 123 by a deposition process. Through the above process encompassed in FIG. 6, the pillar elements 103 are formed in the insulating stacked structure S4 and the layer stack S3.

The memory layer 121 may include a multilayer structure. For example, the memory layer 121 may include a tunnel layer on an outer sidewall of the channel layer 122, a storage layer on an outer sidewall of the tunnel layer, and a blocking layer on an outer sidewall of the storage layer. In an embodiment, the memory layer 121 may include a multilayer structure known from memory technologies, such as ONO (oxide-nitride-oxide), ONONO (oxide-nitride-oxide-nitride-oxide), ONONONO (oxide-nitride-oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), MA BE-SONOS (metal-high-k bandgap-engineered silicon-oxide-nitride-oxide-silicon), and combinations of those layers. The channel layer 122 may include a semiconductor material, such as a doped or undoped semiconductor material. In an embodiment, the channel layer 122 may include polysilicon, such as doped or undoped polysilicon. The insulating pillar 123 may include oxide such as silicon oxide, or other suitable dielectric materials. The pad 124 may include a semiconductor material, such as metal silicide, a doped or undoped semiconductor material. In an embodiment, the pad 124 may include polysilicon, such as doped or undoped polysilicon.

Figure 7:
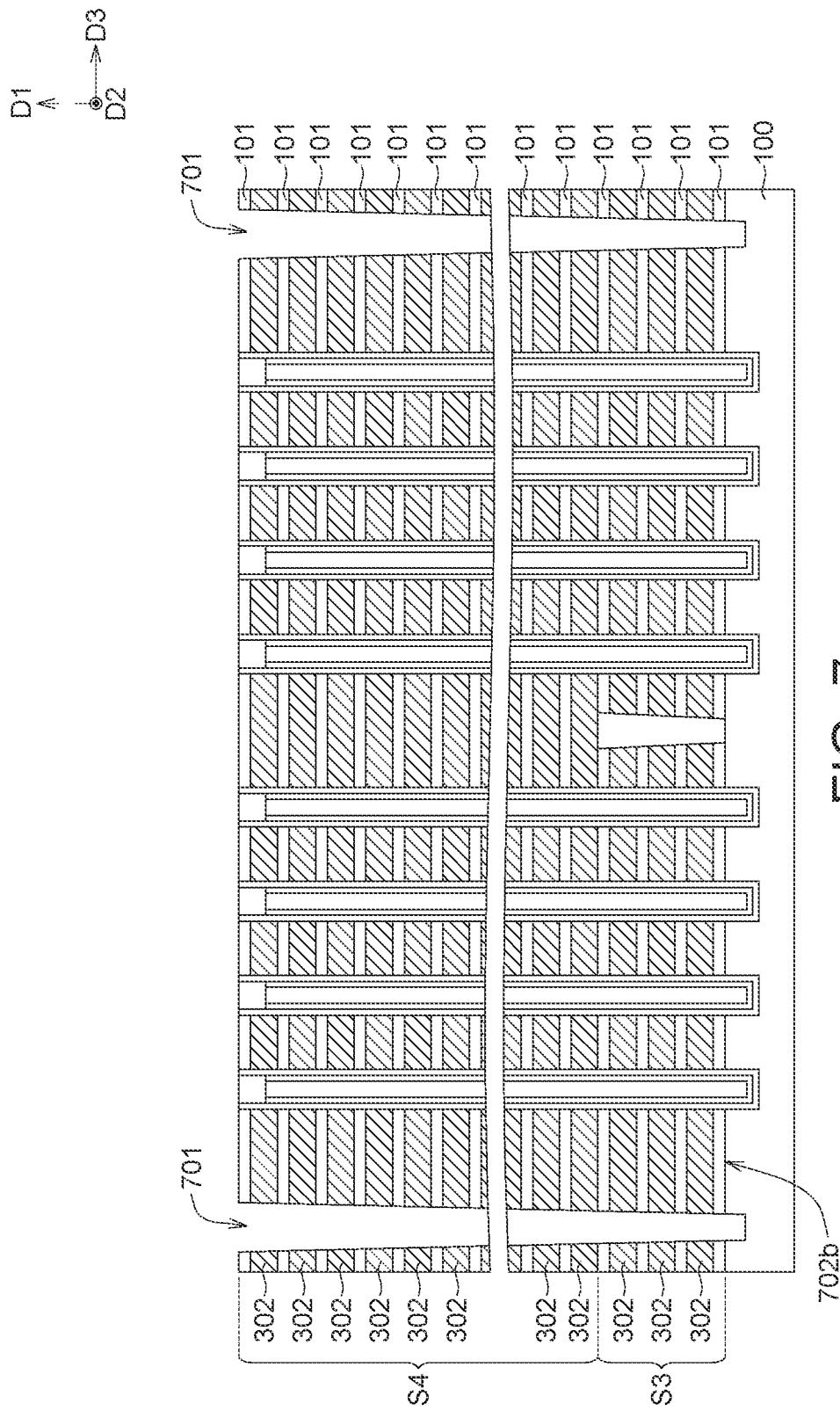

Referring to FIG. 7, slits 701 are formed in the insulating stacked structure S4 and the layer stack S3. For example, an etching process may be performed to the insulating stacked structure S4 and the layer stack S3 to remove part of the insulating stacked structure S4 and part of the layer stack S3 to form slits 701 extending along the first direction D1. The etching process for forming the slits 701 may be stopped when the etching process slightly exceeds a bottom surface 702b of the layer stack S3. The slit 701 exposes sidewalls of the insulating stacked structure S4 and the layer stack S3 serving as the sidewall of the slit 701 and exposes the substrate 100 serving as the bottom of the slit 701.

Figure 8:
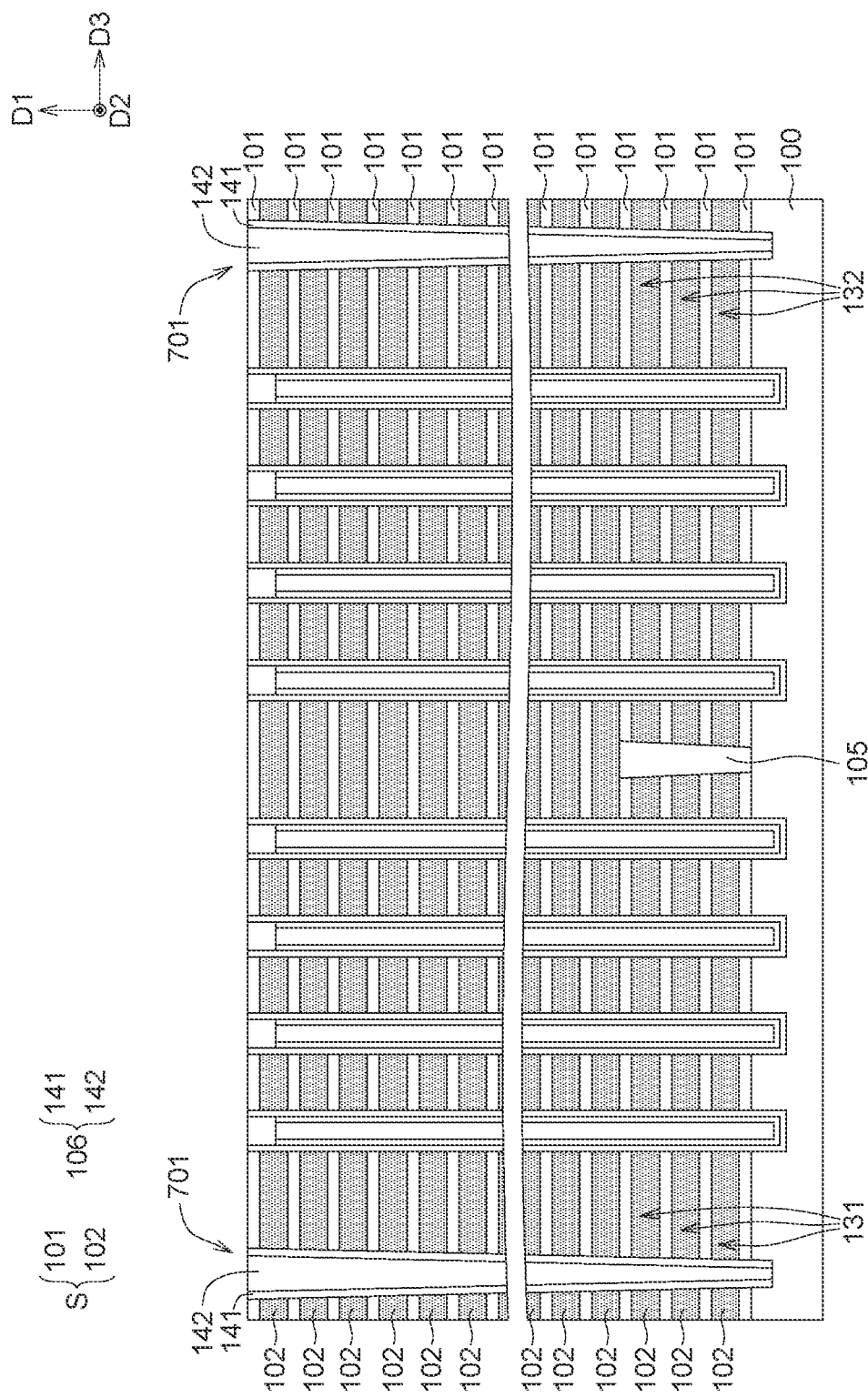

Referring to FIG. 8, the dielectric layers 302 in the insulating stacked structure S4 and the layer stack S3 are replaced by conductive layers 102, and isolation elements 106 are formed in the slits 701. For example, an etching process may be performed to the insulating stacked structure S4 and the layer stack S3 to remove the dielectric layers 302 in the insulating stacked structure S4 and the layer stack S3 through the slits 701, and spaces between the insulating layers 101 are formed. The etching process for removing the dielectric layers 302 would not remove the lower isolation structure 105. In order to ensure that the lower isolation structure 105 is not removed during this etching process, the lower isolation structure 105 may have an etching selectivity different from the etching selectivity of the dielectric layer 302; for example, in an etching process, an etching rate of the dielectric layer 302 may be larger than that of the lower isolation structure 105; by the control of the etching time, the dielectric layer 302 is removed while the lower isolation structure is reserved.

In an embodiment, the lower isolation structure 105 separates the layer stack S3 into two parts isolated from each other, the dielectric layers 302 of the layer stack S3 on opposite sides of the lower isolation structure 105 may be removed through the slits 701 on opposite sides of the lower isolation structure 105.

Then, a conductive material fills the spaces between the insulating layers 101 to form the conductive layers 102 between the insulating layers 101. The dielectric layers 302 on opposite sides of the lower isolation structure 105 (i.e. the dielectric layers 302 in the layer stack S3) are replaced by the conductive material so as to form the conductive layers 102, and the lower isolation structure 105 separates these conductive layers 102 into the conductive strips 131 and 132 electrically isolated from each other. The conductive layer 102 may include a conductive material such as polysilicon or metal. In an embodiment, the conductive layer 102 may include tungsten (W). In an embodiment, at least part of the conductive layers 102 above the lower isolation structure 105 may be functioned as gates. In an embodiment, the above process encompassed in FIG. 8 may be understood as a gate replacement process. After the formation of the conductive layers 102, the stacked structure S including the insulating layers 101 and the conductive layers 102 is formed.

After the formation of the conductive layers 102, isolation films 141 are formed on sidewalls of the slits 701. Then, conductive films 142 fill the remaining spaces in the slits 701. The films 141 and the conductive films 142 may be formed by deposition processes. The isolation film 141 may include a dielectric material such as silicon dioxide. The conductive film 142 may include a conductive material such as polysilicon or metal. In an embodiment, the conductive film 142 may include tungsten.

Figure 9:
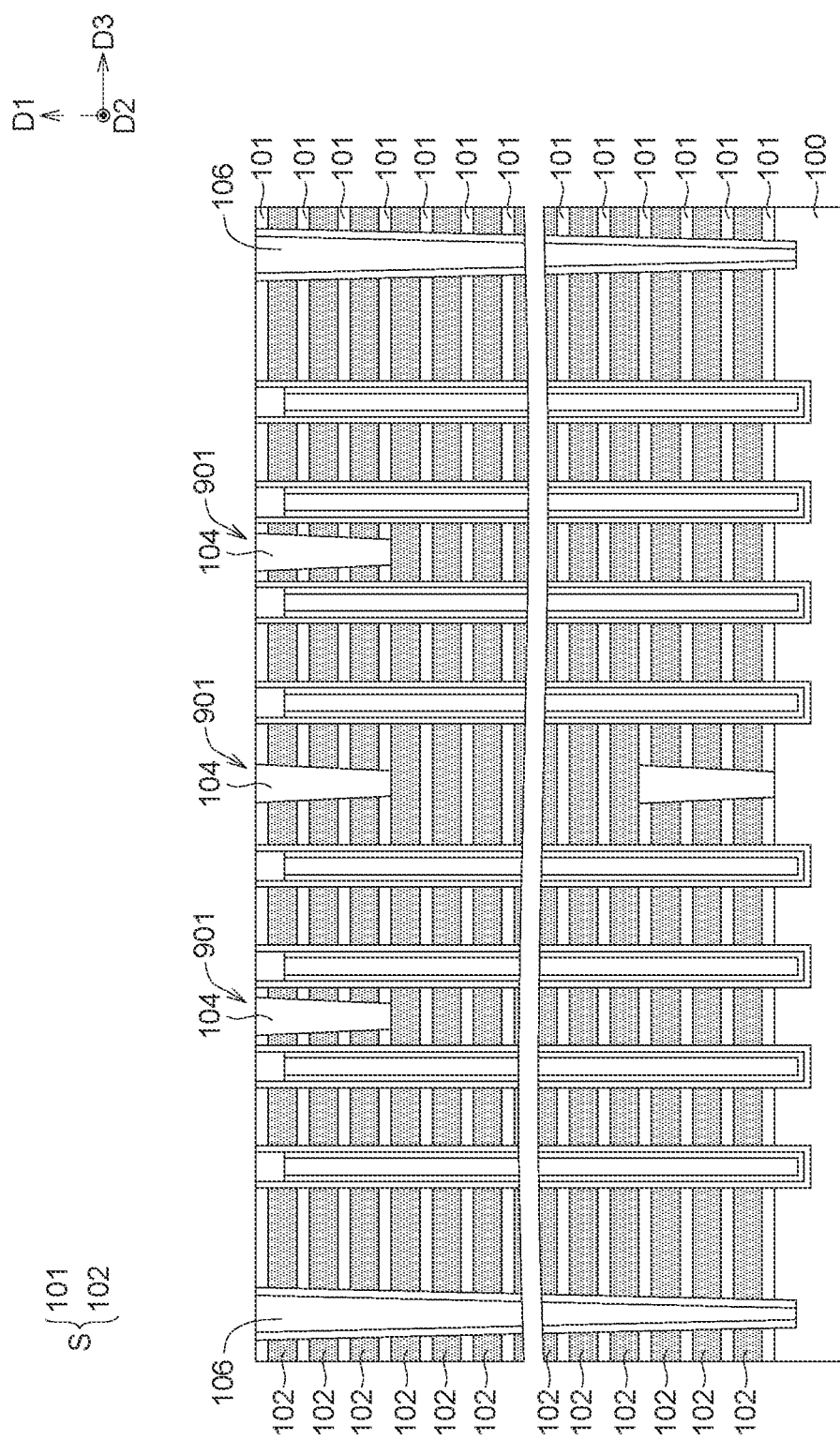

Referring to FIG. 9, upper isolation structures 104 are formed in the stacked structure S. The upper isolation structures 104 may be formed in an upper portion of the stacked structure S and pass through one or more Insulating layers 101 and/or one or more conductive layers 102 of the stacked structure S. For example, an etching process may be performed to the stacked structure S to remove part of the stacked structure S to form trenches 901, and the trenches 901 may extend downwards along the first direction D1, pass through one or more conductive layers 102 (for example, 3-7 conductive layers 102) and stops at the insulating layer 101; the trench 901 exposes a portion of sidewall of the stacked structure S serving as the sidewall of the trench 901 and exposes the insulating layer 101 serving as the bottom of the trench 901; the upper isolation structures 104 are then formed in the trenches 901 by a deposition process. The upper isolation structures 104 may include oxide, or other suitable dielectric materials.

Figure 10:
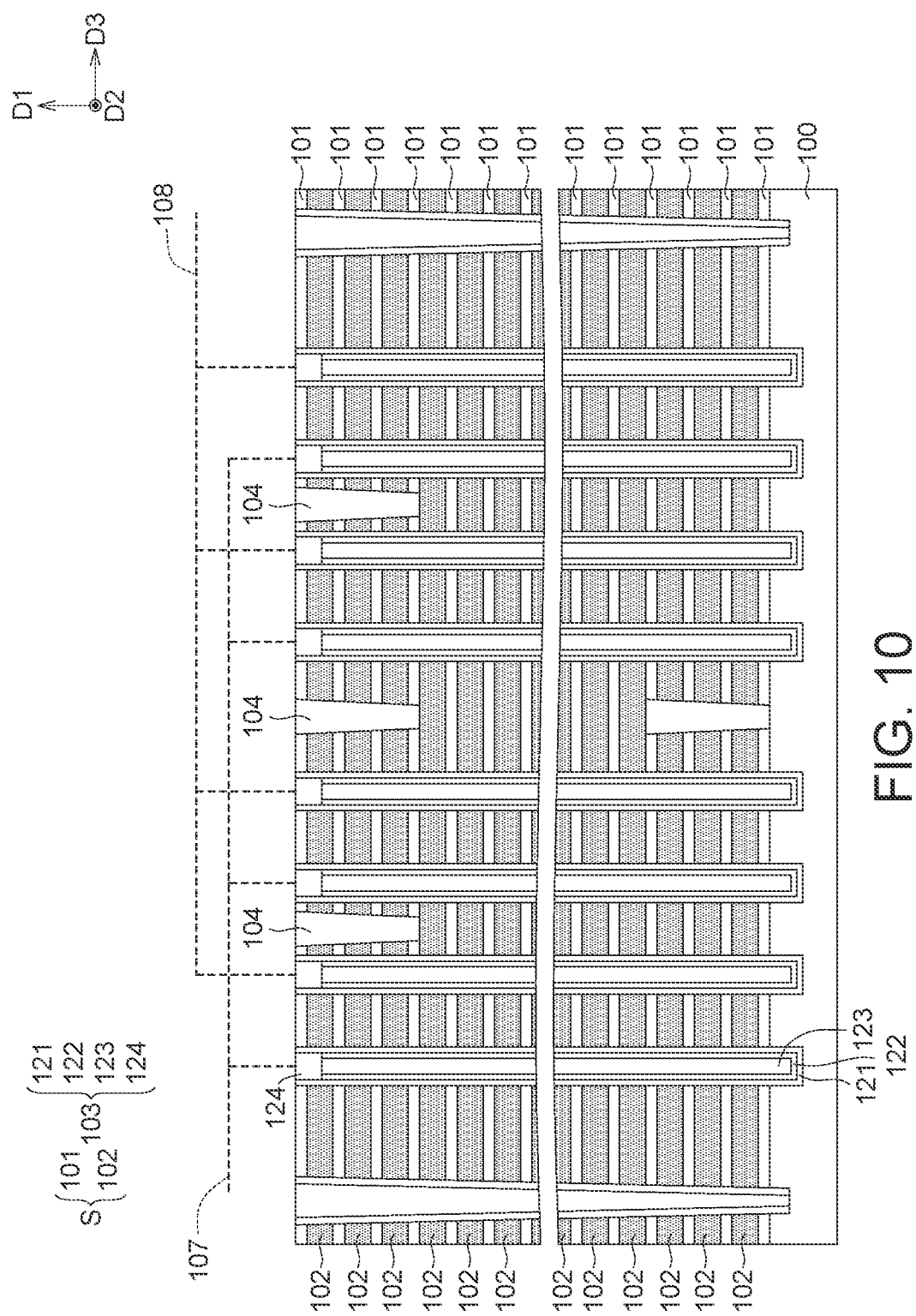

Referring to FIG. 10, at least one first upper conductive structure 107 and at least one second upper conductive structure 108 are formed above the stacked structure S. The first upper conductive structure 107 and the second upper conductive structure 108 may extend along the third direction D3 and be disposed alternately above the stacked structure S. The first upper conductive structure 107 and the second upper conductive structure 108 may include conductive materials such as metal.

In an embodiment, the above manufacturing method may further include formation of tubular elements 109. The formation of tubular elements 109 is exemplarily described below (not shown). In the process encompassed in FIG. 6, more pillar elements 103 are formed, wherein some of the pillar elements 103 may be processed in the process encompassed in FIG. 9 to form the tubular elements 109. The pillar elements 103 used to form the tubular elements 109 may be formed at the location where the upper isolation structure 104 is intended to be formed. In the process encompassed in FIG. 9, the formation of the upper isolation structures 104 may include: performing an etching process to the pillar elements 103 used to form the tubular elements 109 to remove upper portions of the pillar elements 103 to form the tubular elements 109, and performing a deposition process to form upper isolation structures 104 on the tubular elements 109. The memory layer 151 of the tubular elements 109 and the memory layer 121 of the pillar element 103 may include similar materials. The dummy channel layer 152 of the tubular elements 109 and the channel layer 122 of the pillar element 103 may include similar materials. The insulating pillar 153 of the tubular elements 109 and the insulating pillar 123 of the pillar element 103 may include similar materials.

In an embodiment, through the method schematically illustrated in FIGS. 3-10, a memory device 10 shown in FIGS. 1A-1C is provided.

Referring to FIGS. 11-18, FIGS. 11-18 schematically illustrate a method for manufacturing a memory device according to another embodiment of the present disclosure.

Figure 11:
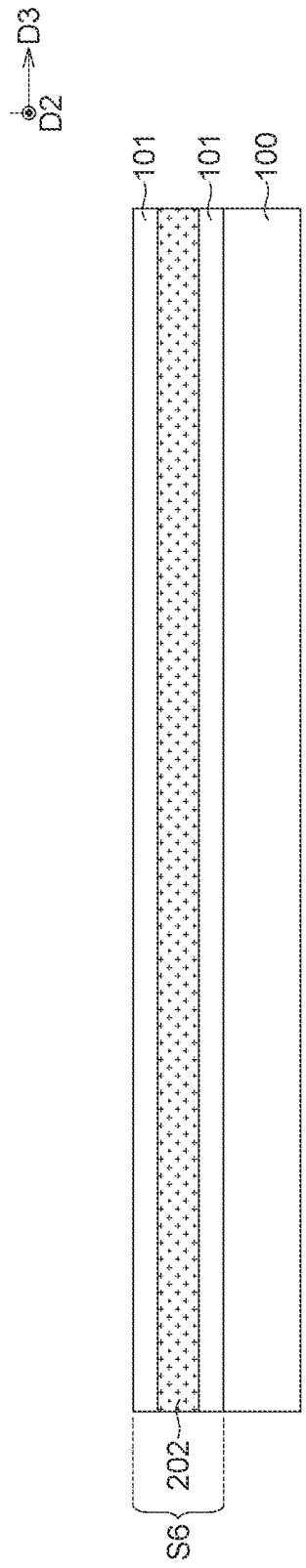
FIGS. 11-18 schematically illustrate a method for manufacturing a memory device according to another embodiment of the present disclosure.

Referring to FIG. 11, a substrate 100 is provided. A layer stack S6 is formed on the substrate 100. The layer stack S6 may include insulating layers 101 and a conductive layer 202 between the insulating layers. For example, the layer stack S6 may be formed by depositing the insulating layers 101 and the conductive layer 202 sequentially. The conductive layer 202 may include a conductive material such as polysilicon or metal.

Figure 12:
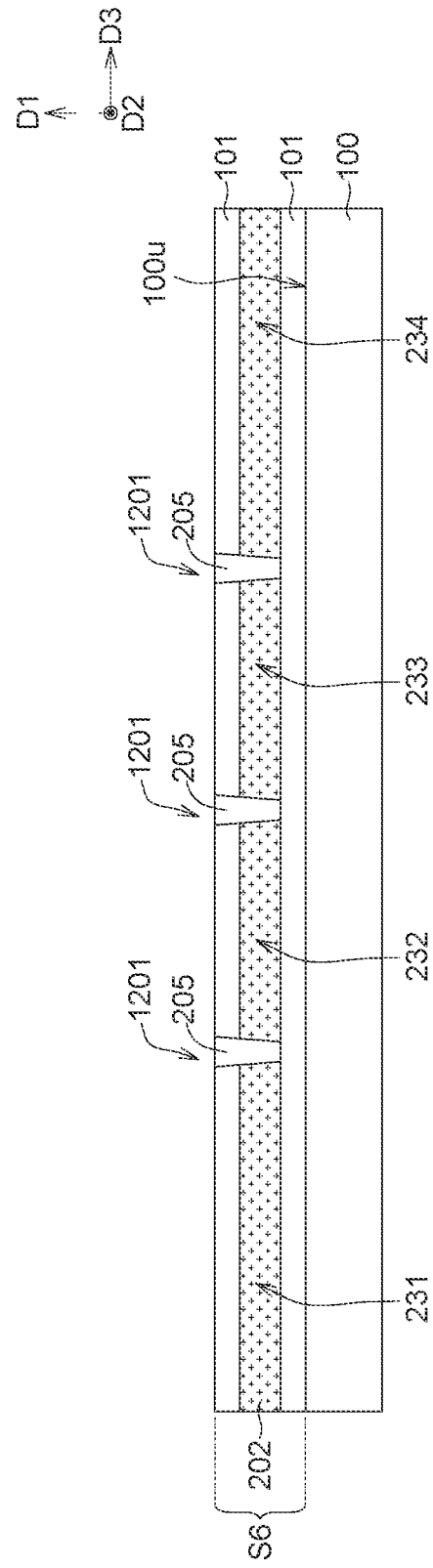

Referring to FIG. 12, lower isolation structures 205 are formed in the layer stack S6. The lower isolation structures 205 may extend down toward the substrate 100. The lower isolation structures 205 may extend along the first direction D1 and the second direction D2, and separate the conductive layer 202 and at least one insulating layer 101 into several parts isolated from each other. The lower isolation structures 205 may separate the conductive layer 202 into conductive strips 231, 232, 233 and 234 electrically isolated from each other. For example, an etching process may be performed to the layer stack S6 to remove part of the insulating layer 101 and part of the conductive layer 202 to form a trench 1201; the trench 1201 extends downwards along the first direction D1 and stops at an upper surface 100u of the substrate 100 or stops at the insulating layer 101 between the conductive layer 202 and the substrate 100; the lower isolation structure 205 may then be formed in the trench 1201 by a deposition process. The lower isolation structure 1205 may include a dielectric material, such as oxide.

Figure 13:
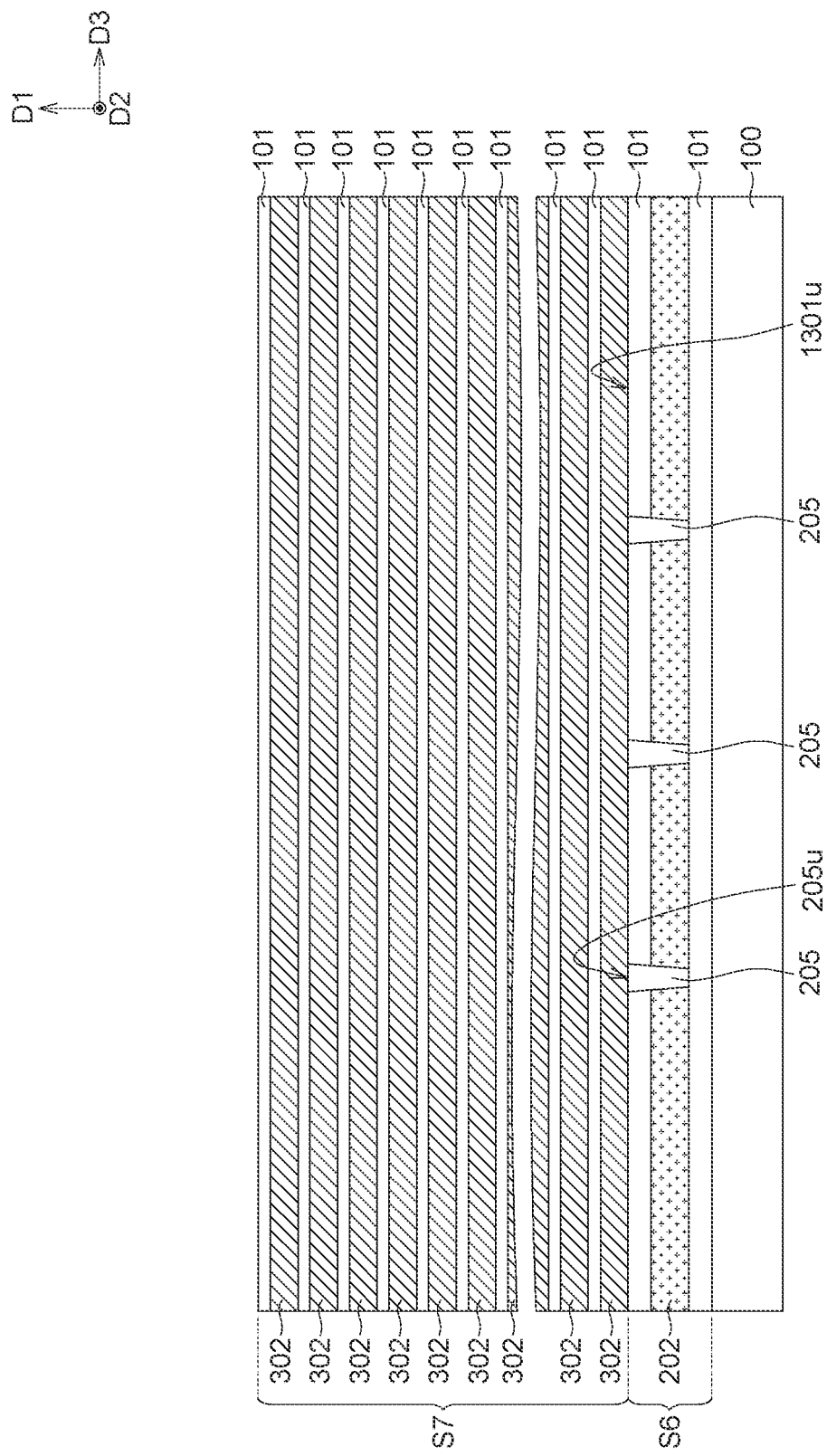

Referring to FIG. 13, an insulating stacked structure S7 is formed on the layer stack S6. The insulating stacked structure S7 may cover an upper surface 205u of the lower isolation structure 205 and an upper surface 1301u of the layer stack S6. The lower isolation structure 205 and the layer stack S6 may be under the insulating stacked structure S7. The insulating stacked structure S7 may include insulating layers 101 and dielectric layers 302 stacked alternately along the first direction D1. For example, the insulating stacked structure S7 may be formed by depositing the insulating layers 101 and the dielectric layers 302 sequentially.

Figure 14:
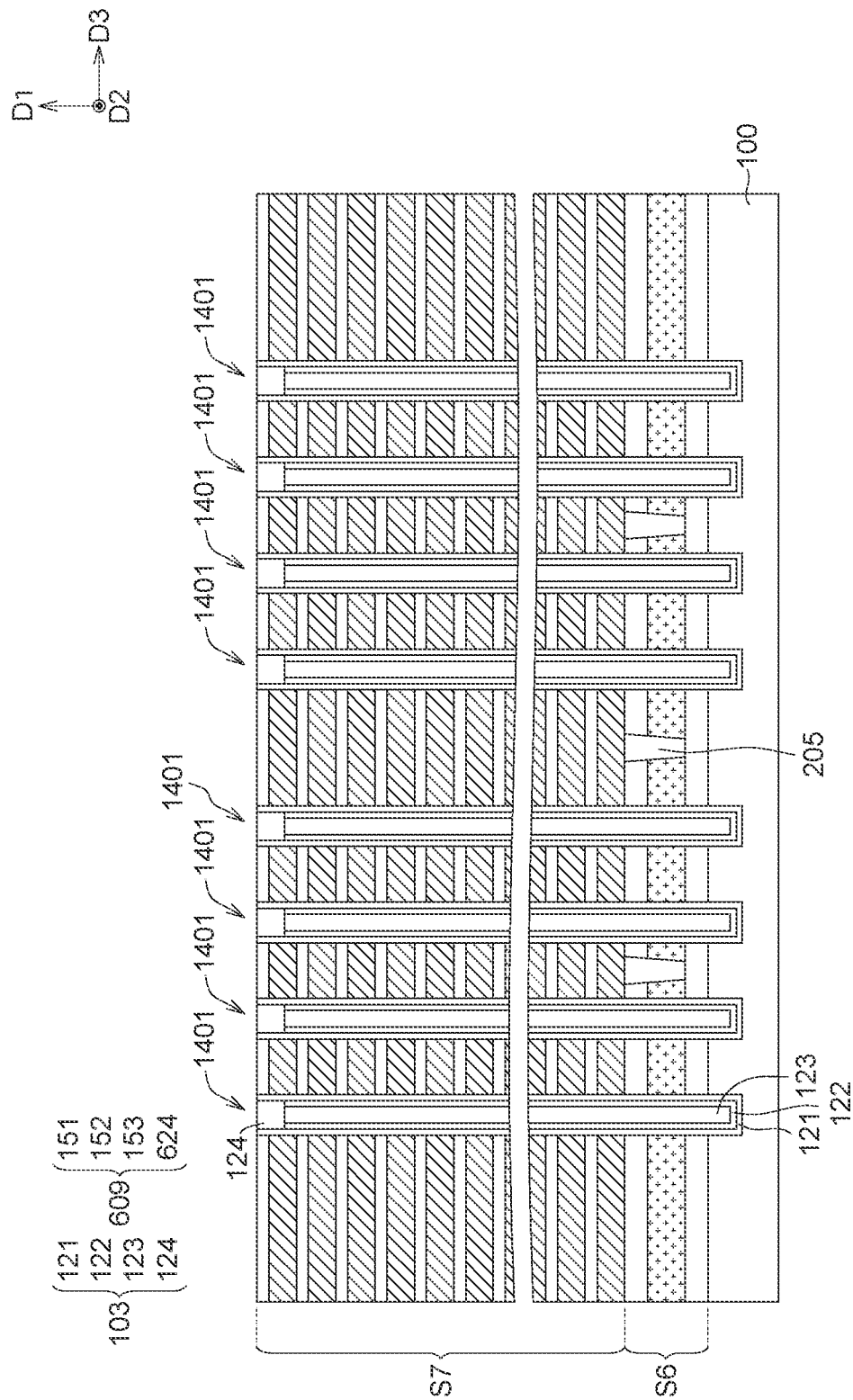

Referring to FIG. 14, pillar elements 103 are formed. The pillar elements 103 may be arranged apart in the insulating stacked structure S7 and the layer stack S6. The pillar element 103 may extend along the first direction D1 and pass through the insulating stacked structure S7 and the layer stack S6. In an embodiment, the formation of the pillar element 103 may include the following steps. The insulating stacked structure S7 and the layer stack S6 are patterned, such as by a photolithography process, to form holes 1401 separated from each other. The hole 1401 extends downwards along the first direction D1 and stops at the substrate 100; the hole 1401 exposes sidewalls of the insulating stacked structure S7 and the layer stack S6 serving as the sidewall of the hole 1401 and exposes the substrate 100 serving as the bottom of the hole 1401. Next, a memory layer 121 may line the hole 1401 by a deposition process and a bottom portion of the memory layer 121 is removed by an etching process. A channel layer 122 may be deposited on sidewalls of the memory layer 121 and contacts with the substrate 100 through the exposed bottom portion of the memory layer 121. An insulating pillar 123 may fill the remaining space in the hole 1401 by a deposition process. Then, an etching back process and/or a chemical-mechanical planarization process may be performed to remove part of the channel layer 122 and part of the insulating pillar 123 to expose part of the sidewall of the memory layer 121. Then, a pad 124 may be formed on the channel layer 122 and the insulating pillar 123 by a deposition process. Through the above process encompassed in FIG. 14, the pillar elements 103 are formed in the insulating stacked structure S7 and the layer stack S6.

Figure 15:
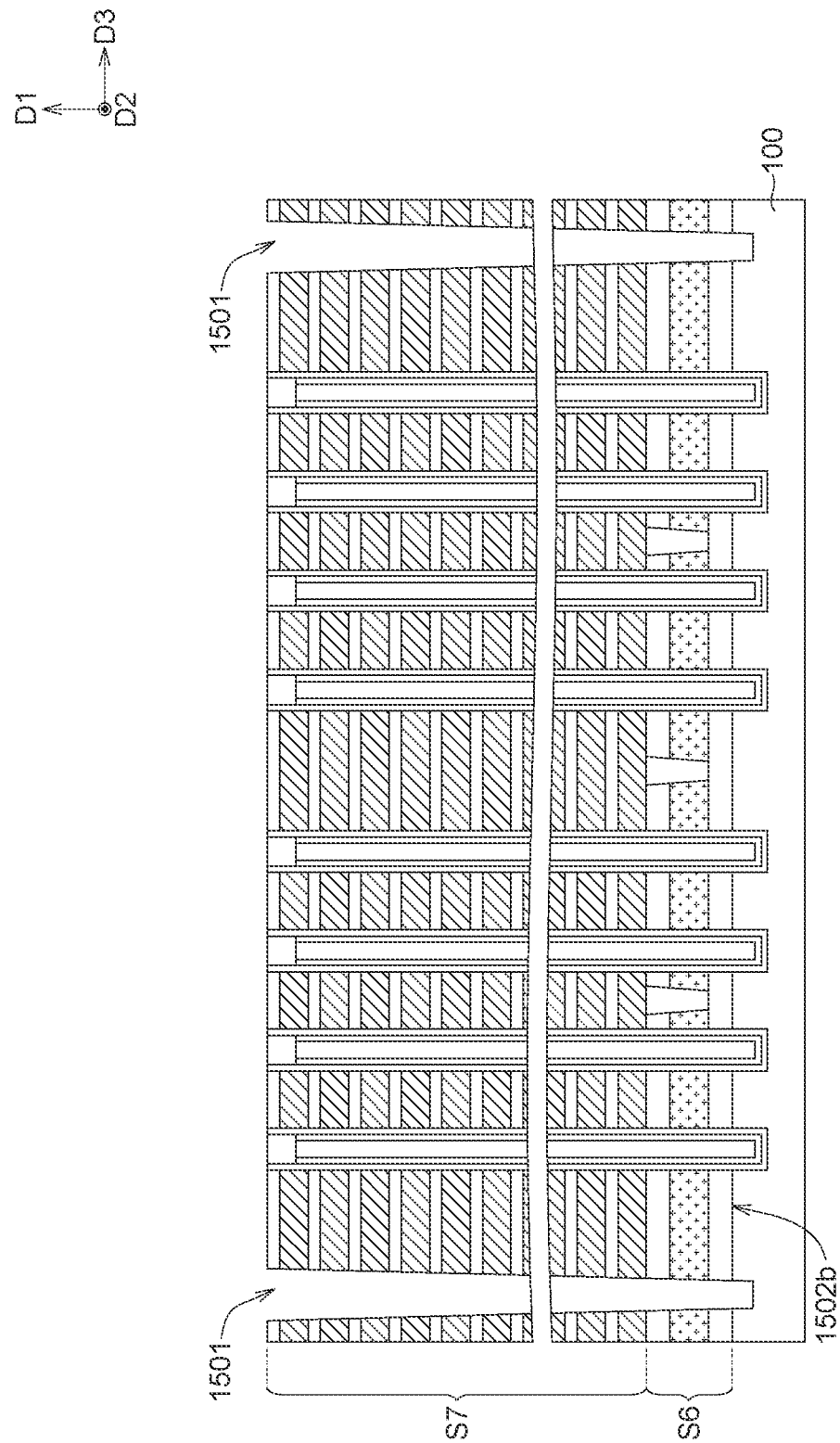

Referring to FIG. 15, slits 1501 are formed in the insulating stacked structure S7 and the layer stack S6. For example, an etching process may be performed to the insulating stacked structure S7 and the layer stack S6 to remove part of the insulating stacked structure S7 and part of the layer stack S6 to form slits 1501 extending along the first direction D1. The etching process for forming the slits 1501 may be stopped when the etching process slightly exceeds a bottom surface 1502b of the layer stack S6. The slit 1501 exposes sidewalls of the insulating stacked structure S7 and the layer stack S6 serving as the sidewall of the slit 1501 and exposes the substrate 100 serving as the bottom of the slit 1501.

Figure 16:
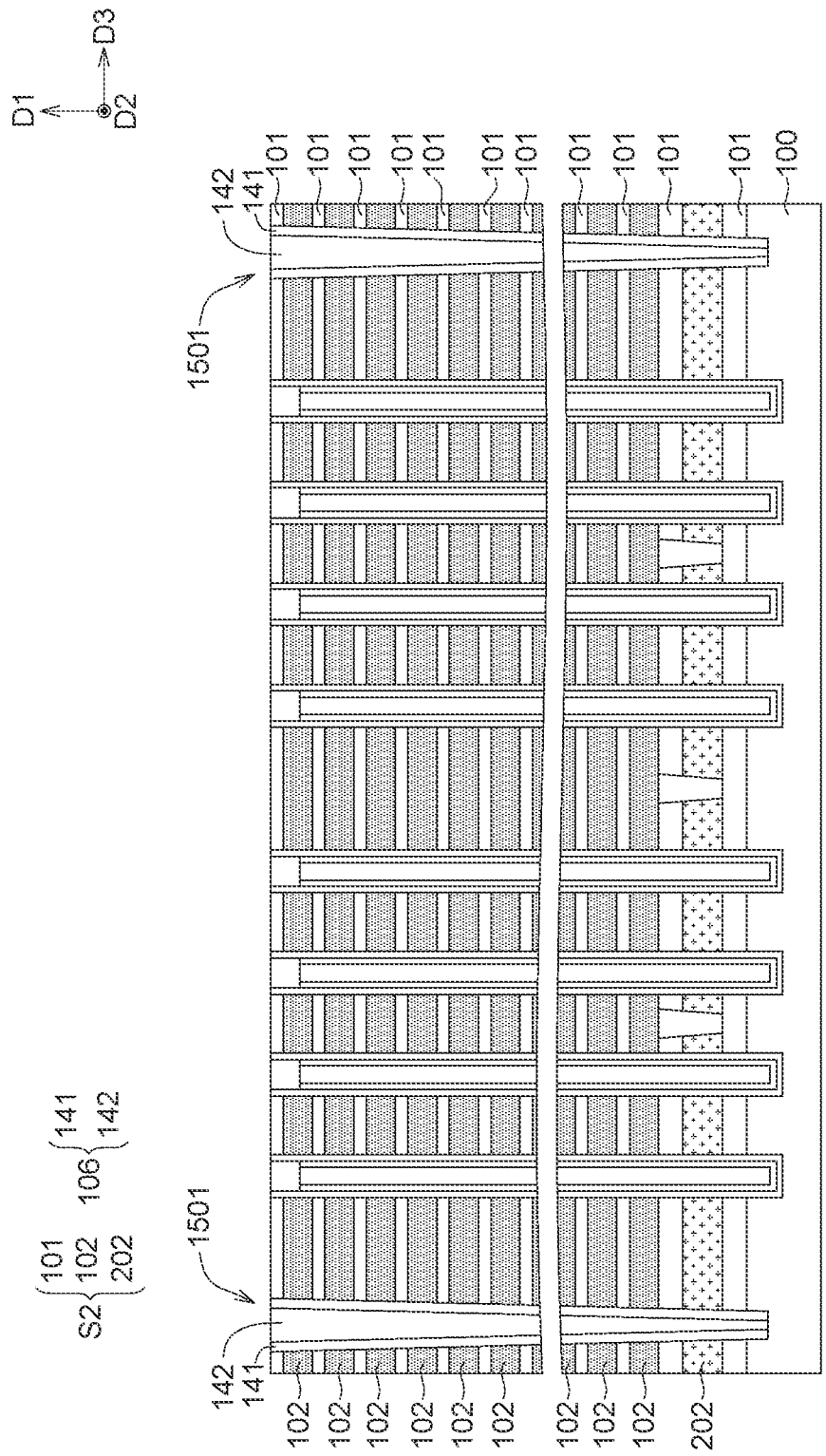

Referring to FIG. 16, the dielectric layers 302 in the insulating stacked structure S7 are replaced by conductive layers 102, and isolation elements 106 are formed in the slits 1501. For example, an etching process may be performed to the insulating stacked structure S7 to remove the dielectric layers 302 in the insulating stacked structure S7 through the slits 1501, and spaces between the insulating layers 101 are formed. Then, a conductive material fills the spaces between the insulating layers 101 to form the conductive layers 102 between the insulating layers 101. The etching process for removing the dielectric layers 302 would not remove the conductive layer 202 and the lower isolation structure 205. In an embodiment, at least part of the conductive layers 102 may be functioned as gates. In an embodiment, the above process encompassed in FIG. 16 may be understood as a gate replacement process. After the formation of the conductive layers 102, the stacked structure S2 including the insulating layers 101, the conductive layers 102 and the conductive layer 202 is formed.

After the formation of the conductive layers 102, isolation films 141 are formed on sidewalls of the slits 1501. Then, conductive films 142 fill the remaining spaces in the slits 1501. The films 141 and the conductive films 142 may be formed by deposition processes.

Figure 17:
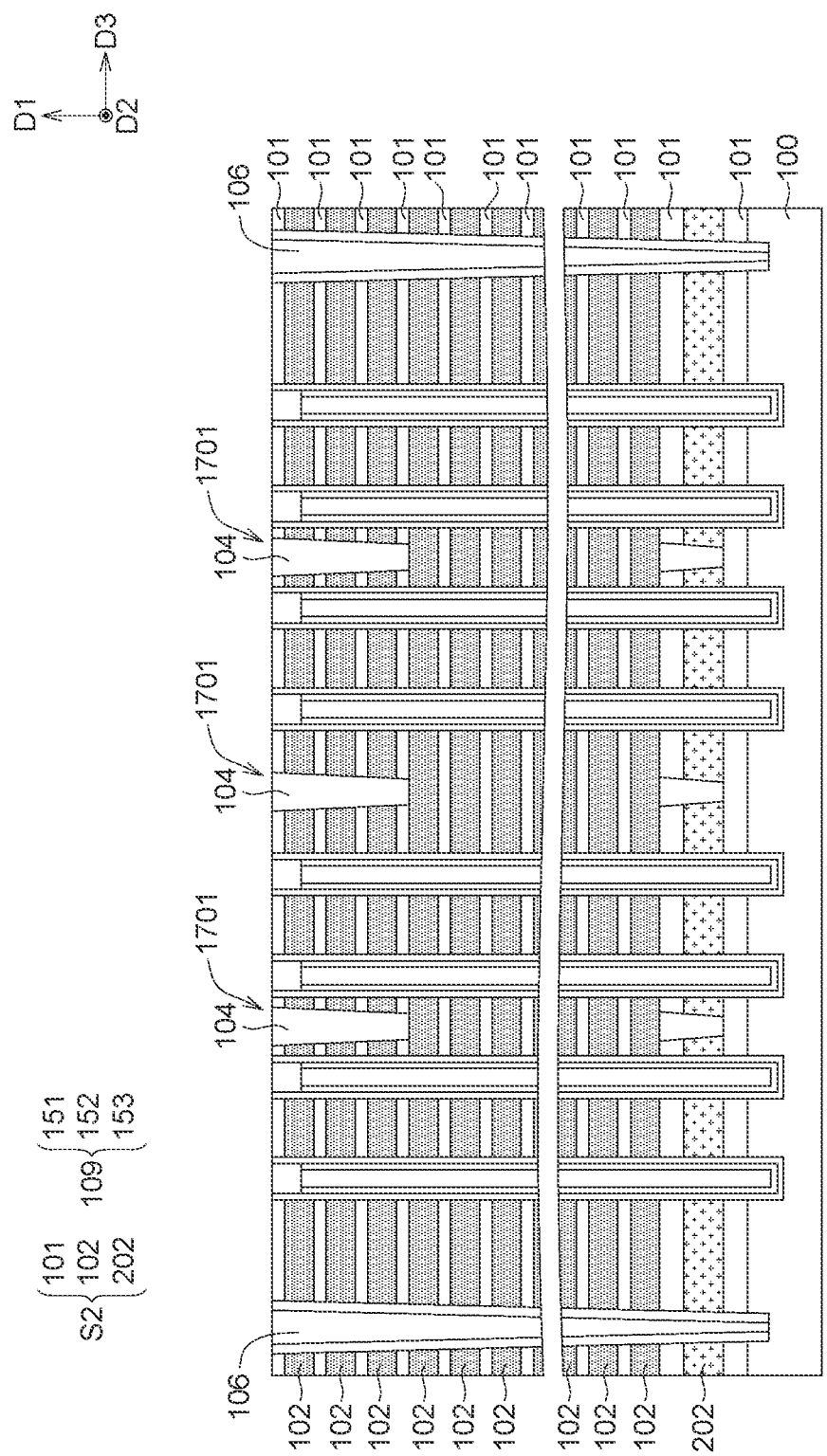

Referring to FIG. 17, upper isolation structures 104 are formed in the stacked structure S2. The upper isolation structures 104 may be formed in an upper portion of the stacked structure S2 and pass through one or more insulating layers 101 and/or one or more conductive layers 102 of the stacked structure S2. For example, an etching process may be performed to the stacked structure S2 to remove part of the stacked structure S2 to form trenches 1701, and the trenches 1701 may extend downwards along the first direction D1, pass through one or more conductive layers 102 (for example, 3-7 conductive layers 102) and stops at the insulating layer 101; the trench 1701 exposes a portion of sidewall of the stacked structure S2 serving as the sidewall of the trench 1701 and exposes the insulating layer 101 serving as the bottom of the trench 1701; the upper isolation structures 104 are then formed in the trenches 1701 by a deposition process.

Figure 18:
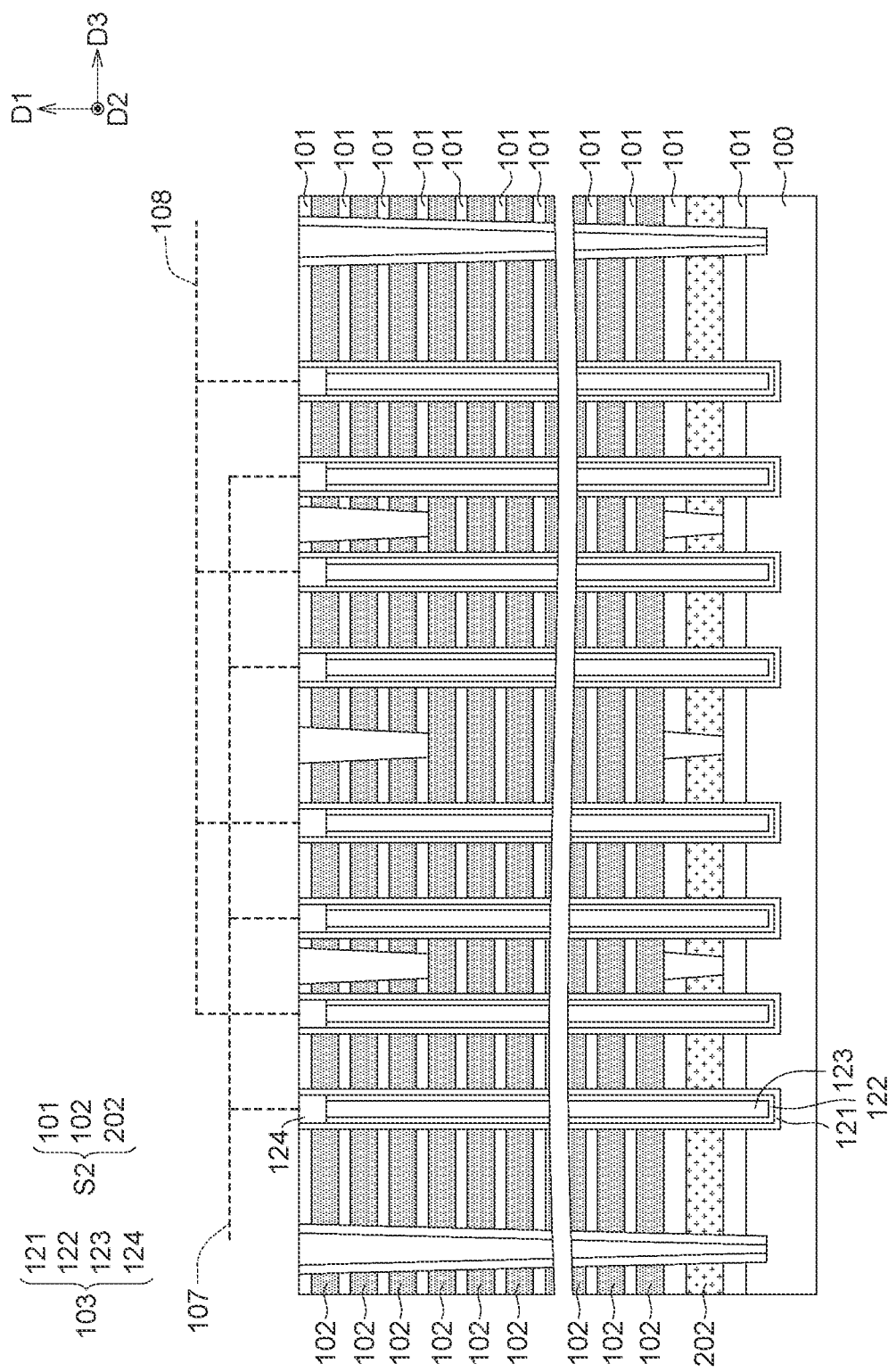

Referring to FIG. 18, at least one first upper conductive structure 107 and at least one second upper conductive structure 108 are formed above the stacked structure S2. The first upper conductive structure 107 and the second upper conductive structure 108 may extend along the third direction D3 and be disposed alternately above the stacked structure S2.

In an embodiment, the above manufacturing method may further include formation of tubular elements 109. The formation of tubular elements 109 is exemplarily described below (not shown). In the process encompassed in FIG. 14, more pillar elements 103 are formed, wherein some of the pillar elements 103 may be processed in the process encompassed in FIG. 17 to form the tubular elements 109. The pillar elements 103 used to form the tubular elements 109 may be formed at the location where the upper isolation structure 104 is intended to be formed. In the process encompassed in FIG. 17, the formation of the upper isolation structures 104 may include: performing an etching process to the pillar elements 103 used to form the tubular elements 109 to remove upper portions of the pillar elements 103 to form the tubular elements 109, and performing a deposition process to form upper isolation structures 104 on the tubular elements 109. The memory layer 151 of the tubular elements 109 and the memory layer 121 of the pillar element 103 may include similar materials. The dummy channel layer 152 of the tubular elements 109 and the channel layer 122 of the pillar element 103 may include similar materials. The insulating pillar 153 of the tubular elements 109 and the insulating pillar 123 of the pillar element 103 may include similar materials.

In an embodiment, through the method schematically illustrated in FIGS. 11-18, a memory device 20 shown in FIGS. 2A-2B is provided. In the method shown in FIGS. 11-18, the conductive strips 231, 232, 233 and 234 are formed prior to the conductive layer 102. The method shown in FIGS. 11-18 can be applied to a memory device including a plurality of lower isolation structures.

As shown in FIGS. 1A, 1B, 2A and 2B, the memory device 10 includes three upper isolation structures 104 and an lower isolation structure 105 between two isolation elements 106, and the memory device 20 includes three upper isolation structures 104 and three lower isolation structures 205 between two isolation elements 106. The present disclosure is not limited thereto. The present disclosure can be applied to the memory device including more or less upper isolation structures and/or lower isolation structures and/or pillar elements, which will become better understood with regard to the following description and FIGS. 19-20.

Figure 19:
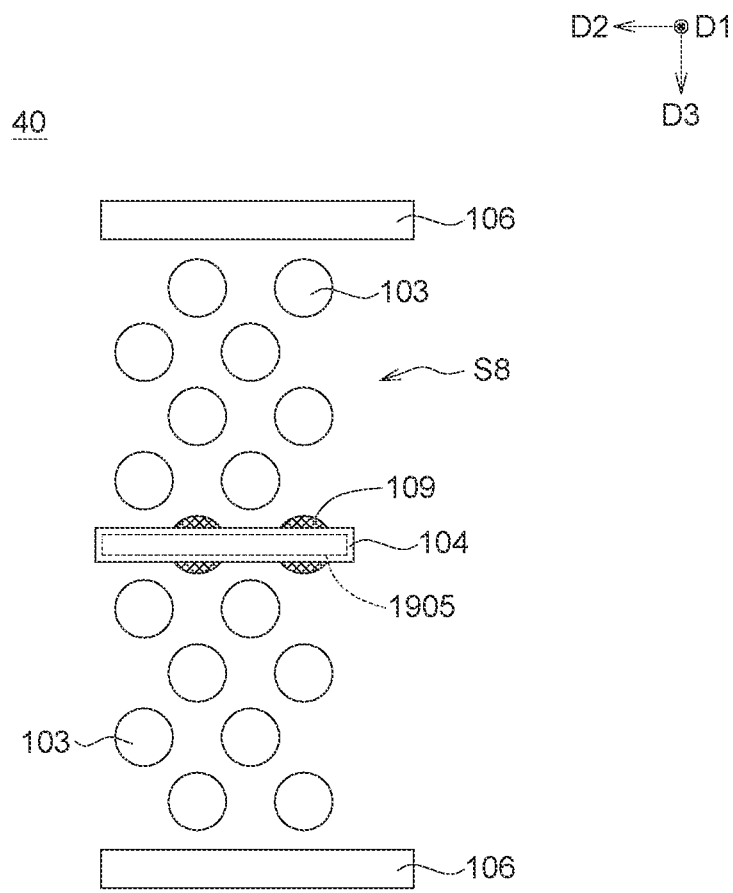
FIG. 19 illustrates a schematic top view of a memory device according to an embodiment of the present disclosure.

Referring to FIG. 19, FIG. 19 illustrates a schematic top view of a memory device 40 according to an embodiment of the present disclosure.

The memory device 40 may include a substrate (not shown), a stacked structure S8 on the substrate, and pillar elements 103 extending along the first direction D1 and pass through the stacked structure S8. At least one upper isolation structure 104 is disposed in an upper portion of the stacked structure S8. At least one lower isolation structure 1905 is disposed in a lower portion of the stacked structure S8. Tubular element 109 is under the corresponding at least one the upper isolation structure 104. Isolation elements 106 extend along the first direction D1 and pass through the stacked structure S8. The pillar elements 103, the at least one upper isolation structure 104, the tubular element 109 and the at least one lower isolation structure 1905 are within an area drawn by Isolation elements 106. Upper conductive structures are overlying the stacked structure S8 and electrically connect to the corresponding pillar elements 103 (not shown). The stacked structure S8 may be similar to the stacked structure S of FIG. 1B or the stacked structure S2 of FIG. 2B. The lower isolation structure 1905 may be similar to the lower isolation structure 105 of FIG. 1B or the lower isolation structure 205 of FIG. 2B. The position of the lower isolation structure 1905 of the memory device 40 in a plane containing the second direction D2 and the third direction D3 may roughly align with the position of the upper isolation structure 104; for example, in FIG. 19, the lower isolation structure 1905 that roughly align with the upper isolation structure 104 is indicated by dashed lines. In this embodiment, the lower isolation structure 1905 separates at least one conductive layer in the stacked structure S8 into two conductive strips; the two conductive strips are electrically isolated from each other by the lower isolation structure 1905 and may be functioned as ground selection lines.

In the memory device 40, the number of the pillar elements 103 between two isolation elements 106 is less than the number of the pillar elements 103 between two isolation elements 106 in the memory device 10. In the memory device 40, the number of the upper isolation structure 104 between two isolation elements 106 is less than the number of the upper isolation structure 104 between two isolation elements 106 in the memory device 10. The method for manufacturing the memory device 40 and the specific structure of the memory device 40 can be realized by the analogy according to the aforementioned descriptions.

Figure 20:
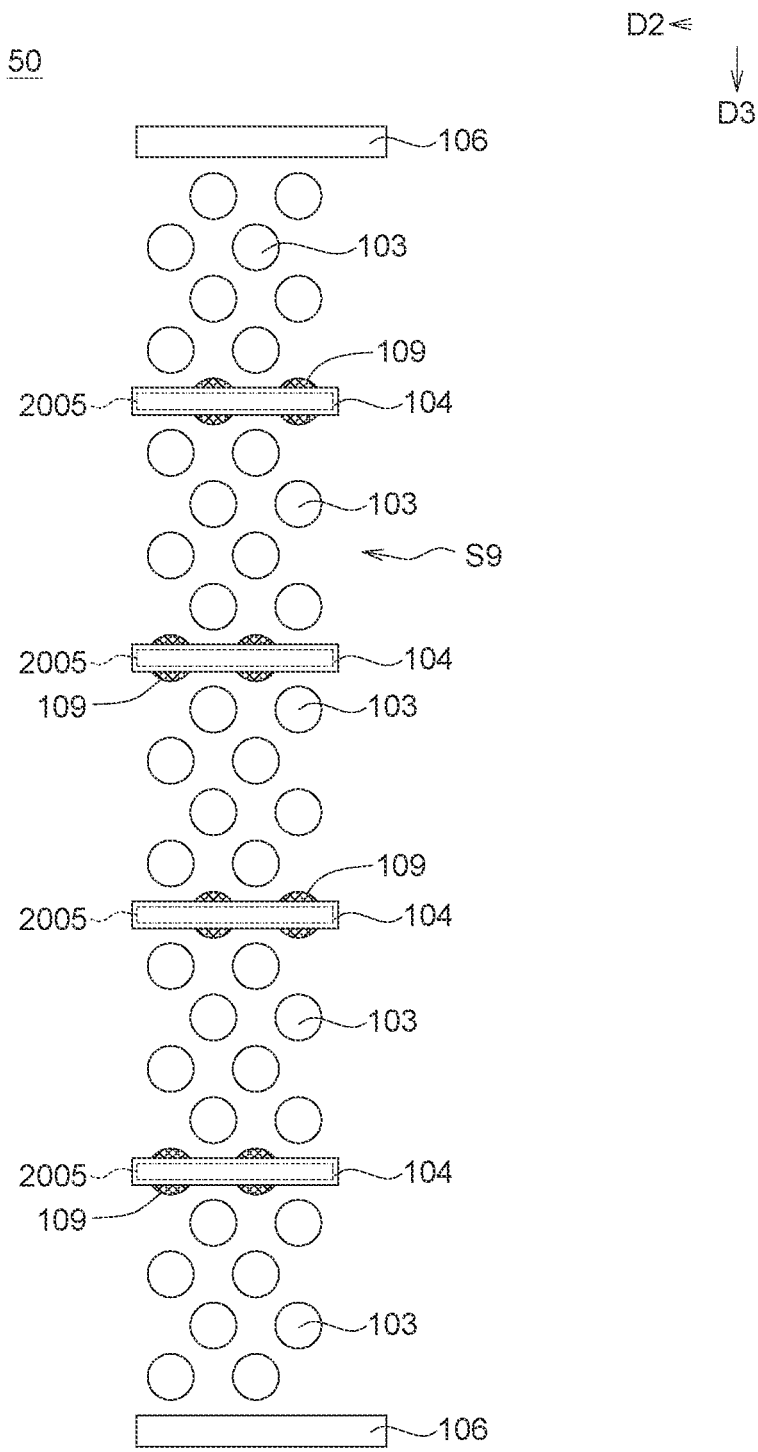
FIG. 20 illustrates a schematic top view of a memory device according to an embodiment of the present disclosure.

Referring to FIG. 20, FIG. 20 illustrates a schematic top view of a memory device 50 according to an embodiment of the present disclosure.

The memory device 50 may include a substrate (not shown), a stacked structure S9 on the substrate, pillar elements 103 extending along the first direction D1 and pass through the stacked structure S9, isolation structures 104 disposed in an upper portion of the stacked structure S9, lower isolation structures 2005 disposed in a lower portion of the stacked structure S9, tubular elements 109 under the upper isolation structures 104, isolation elements 106 and upper conductive structures (not shown). The stacked structure S9 may be similar to the stacked structure S2 of FIG. 2B. The lower isolation structure 2005 may be similar to the lower isolation structure 205 of FIG. 2B. The position of the lower isolation structures 2005 of the memory device 50 in a plane containing the second direction D2 and the third direction D3 may roughly align with the position of the upper isolation structures 104; for example, in FIG. 20, the lower isolation structures 2005 that roughly align with the upper isolation structures 104 respectively are indicated by dashed lines. In this embodiment, the lower isolation structures 2005 separate at least one conductive layer in the stacked structure S9 into five conductive strips; the five conductive strips are electrically isolated from each other by the lower isolation structure 2005 and may be functioned as ground selection lines.

In the memory device 50, the number of the pillar elements 103 between two isolation elements 106 is larger than the number of the pillar elements 103 between two isolation elements 106 in the memory device 20. In the memory device 50, the number of the upper isolation structure 104 between two isolation elements 106 is larger than the number of the upper isolation structure 104 between two isolation elements 106 in the memory device 20. The method for manufacturing the memory device 50 and the specific structure of the memory device 50 can be realized by the analogy according to the aforementioned descriptions.

The present disclosure provides memory devices including lower isolation structures and methods for manufacturing the same, and the lower isolation structures separate part of the conductive layers in the memory device into conductive strips electrically isolated from each other. With such configurations, the number of the memory strings controlled by single conductive strip such as ground selection line can be decreased. Specifically, the lower isolation structure of the present disclosure can be applied to a block of a memory device, and the memory strings in the block are controlled by multiple ground selection lines; during an operation of the memory device, a voltage is applied to a ground selection line, which will hereafter be cited as selected ground selection line, electrically connected to a memory string including a selected memory cell to turn on one or more ground selection transistors electrically connected to the selected ground selection line, and one or more ground selection transistors electrically connected to the other ground selection line (or the other ground selection lines), which will hereafter be cited as unselected ground selection line, in the block remains off; one or more channel layers electrically connected to the unselected ground selection line would not be affected by the voltage applied to the selected ground selection line, and no capacitance is generated in one or more channel layers electrically connected to the unselected ground selection line. That is to say, in the memory device of the present disclosure, the number of the memory strings affected by the operating voltage is decreased, which can effectively decrease loads on the word lines and the problem of read disturbance. Moreover, in the manufacturing method of the present disclosure, the conductive layer separated by the lower isolation structure can be formed before the formation of the lower isolation structure, such method can increase the number of the lower isolation structures in the memory device, and decrease the number of the memory strings controlled by single ground selection line in a block to decrease loads on the word lines and the problem of read disturbance. The memory device of the present disclosure may further include tubular elements, thereby improving the process window.

It is noted that the structures and methods as described above are provided for illustration. The disclosure is not limited to the configurations and procedures disclosed above. Other embodiments with different configurations of known elements can be applicable, and the exemplified structures could be adjusted and changed based on the actual needs of the practical applications. It is, of course, noted that the configurations of figures are depicted only for demonstration, not for limitation. Thus, it is known by people skilled in the art that the related elements and layers in a memory device, the shapes or positional relationship of the elements and the procedure details could be adjusted or changed according to the actual requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
   a stacked structure comprising conductive layers;
   a lower isolation structure in the stacked structure and having an upper surface in a lower portion of the stacked structure, wherein the lower isolation structure separates at least one conductive layer of the conductive layers into a first conductive strip and a second conductive strip, the first conductive strip and the second conductive strip are electrically isolated from each other;
   two memory strings in the stacked structure and electrically connected to the first conductive strip and the second conductive strip respectively;
   isolation elements in the stacked structure; and
   blocks separated from each other by the isolation elements, wherein the lower isolation structure is in one of the blocks between two adjacent isolation elements of the isolation elements.

2. The memory device according to claim 1, further comprising a first channel layer and a second channel layer, wherein the first channel layer and the second channel layer have tubular shapes and pass through the stacked structure, the first channel layer and the second channel layer are disposed on opposite sides of the lower isolation structure, one of the two memory strings electrically connected to the first conductive strip is electrically connected to the first channel layer, the other of the two of memory strings electrically connected to the second conductive strip is electrically connected to the second channel layer.

3. The memory device according to claim 2, further comprising an upper conductive structure above the stacked structure, wherein the upper conductive structure is electrically connected to the first channel layer and the second channel layer.

4. The memory device according to claim 1, further comprising an upper isolation structure in the stacked structure, wherein the upper isolation structure extends along a first direction and separates at least one conductive layer disposed in an upper portion of the stacked structure, the upper isolation structure at least partially overlaps the lower isolation structure in the first direction.

5. The memory device according to claim 4, wherein more than one conductive layers of the conductive layers are disposed between the upper isolation structure and the lower isolation structure and are not separated by the upper isolation structure and the lower isolation structure.

6. The memory device according to claim 4, wherein the one of the blocks where the lower isolation structure is comprises sub-blocks separated from each other by the upper isolation structure.

7. The memory device according to claim 1, wherein the lower isolation structure comprises a dielectric material.

8. The memory device according to claim 1, wherein the lower isolation structure separates at least three conductive layers of the conductive layers.

9. The memory device according to claim 1, wherein at least one conductive layer near a bottom of the stacked structure has a different material than other conductive layers.

10. The memory device according to claim 9, wherein the at least one conductive layer near the bottom of the stacked structure comprises polysilicon.

11. The memory device according to claim 9, wherein a conductive layer of the conductive layers not separated by the lower isolation structure has a first thickness, the at least one conductive layer near the bottom of the stacked structure has a second thickness larger than the first thickness.

12. The memory device according to claim 6, wherein the lower isolation structure is between the sub-blocks.

13. The memory device according to claim 4, wherein the upper isolation structure separates the at least one conductive layer disposed in the upper portion of the stacked structure into a third conductive strip and a fourth conductive strip, and the third conductive strip and the fourth conductive strip are functioned as string selection lines.

14. The memory device according to claim 11, wherein a ratio of the second thickness to the first thickness is in a range of 4 to 7.

15. The memory device according to claim 1, wherein the first conductive strip is functioned as a first ground selection line, and the second conductive strip is functioned as a second ground selection line.

16. The memory device according to claim 1, further comprising an upper isolation structure in the one of the blocks where the lower isolation structure is, the one of the blocks where the lower isolation structure comprises sub-blocks separated from each other by the upper isolation structure, and the lower isolation structure is between the sub-blocks.

* * * * *